(12) United States Patent
Son et al.

(10) Patent No.: US 8,929,165 B2
(45) Date of Patent: Jan. 6, 2015

(54) MEMORY DEVICE

(75) Inventors: Jong-pil Son, Seongnam-si (KR);
Young-soo Sohn, Seoul-si (KR)

(73) Assignee: Samsung Electronics Co., Ltd.,
Samsung-ro, Yeongtong-gu, Suwon-si,
Gyeonggi-do (KR)

( * ) Notice: Subject to any disclaimer, the term of this patent is extended or adjusted under 35 U.S.C. 154(b) by 45 days.

(21) Appl. No.: 13/611,084

(22) Filed: Sep. 12, 2012

(65) Prior Publication Data

US 2013/0163355 A1 Jun. 27, 2013

Related U.S. Application Data

(60) Provisional application No. 61/578,488, filed on Dec. 21, 2011.

(30) Foreign Application Priority Data

Mar. 12, 2012 (KR) ........................ 10-2012-0025222

(51) Int. Cl.
*G11C 8/00* (2006.01)
*G11C 11/408* (2006.01)
*G11C 29/04* (2006.01)
*G11C 29/00* (2006.01)
*G11C 16/08* (2006.01)

(52) U.S. Cl.
CPC ............... *G11C 29/04* (2013.01); *G11C 16/08* (2013.01); *G11C 29/787* (2013.01); *G11C 11/4087* (2013.01); *G11C 8/00* (2013.01)
USPC ................... 365/200; 365/49.17; 365/189.07; 365/230.01

(58) Field of Classification Search
CPC ........ G11C 29/04; G11C 29/787; G11C 8/00; G11C 11/4087; G11C 16/08
USPC .................................. 365/200, 49.17, 189.07
See application file for complete search history.

(56) References Cited

U.S. PATENT DOCUMENTS

| 7,839,707 | B2 | 11/2010 | Aakjer | |
|---|---|---|---|---|
| 2001/0030896 | A1* | 10/2001 | Ooishi | 365/200 |
| 2003/0133351 | A1* | 7/2003 | Hidaka | 365/230.03 |
| 2003/0154422 | A1* | 8/2003 | Blodgett | 714/7 |
| 2010/0157656 | A1* | 6/2010 | Tsuchida | 365/148 |
| 2013/0007544 | A1* | 1/2013 | Nemazie et al. | 714/723 |

FOREIGN PATENT DOCUMENTS

| JP | 2004-039680 | 2/2004 |
|---|---|---|
| KR | 100295047 B1 | 4/2001 |
| KR | 1020110076223 A | 7/2011 |

* cited by examiner

*Primary Examiner* — Ly D Pham
(74) *Attorney, Agent, or Firm* — Muir Patent Consulting, PLLC

(57) ABSTRACT

A memory device including: a memory cell array including normal memory cells and spare memory cells arranged in rows and columns including normal columns including the normal memory cells and at least one spare column including spare memory cells, a segment match determining circuit configured to compare a segment address with row address information corresponding to a failed segment and to generate a load control signal, and a column match determining circuit configured to compare column address information corresponding to a failed column in response to the load control signal with a column address and to generate a column address replacement control signal, wherein the memory cells connected to fail columns of the fail segment are replaced with memory cells connected to columns of the spare memory cells in response to the column address replacement control signal.

10 Claims, 15 Drawing Sheets

MEMORY DEVICE

CROSS-REFERENCE TO RELATED APPLICATIONS

This application claims the benefits of U.S. Patent Application No. 61/578,488, filed on Dec. 21, 2011, in the USPTO, and Korean Patent Application No. 10-2012-0025222, filed on Mar. 12, 2012, in the Korean Intellectual Property Office, the disclosures of which are incorporated herein in their entirety by reference.

BACKGROUND

Example embodiments relate to a memory device, and more particularly to, a memory device including a repair circuit that efficiently repairs defective cells.

Memory devices have a wide range of applications in a variety of electronic products, for example, computers or mobile systems. The fast development of multimedia has recently led to a demand for compact and mass storage memory devices. Accordingly, as manufacturing processes of memory devices are subdivided, the number of defective cells of memory devices has increased. Such an increase in defective cells causes a reduction in production yield of memory devices and makes it difficult to secure memory capacity. Also, a plurality of additional spare cells is necessary for repairing defective cells, which makes it much more difficult to realize compact and mass storage memory devices.

SUMMARY

Some example embodiments provide a memory device including a repair circuit capable of minimizing spare cells and fuse circuits and efficiently repairing defective cells in segment circuits.

According to one example embodiment, there is provided a memory device including: a memory cell array including normal memory cells and spare memory cells arranged in rows and columns including normal columns including the normal memory cells and at least one spare column including spare memory cells, wherein the rows are divided into a plurality of segments; a segment match determining circuit configured to compare a segment address received at the memory device with row address information corresponding to a failed segment and to generate a load control signal; and a column match determining circuit configured to compare column address information corresponding to a failed column in response to the load control signal with a column address received at the memory device and to generate a column address replacement control signal, wherein the memory device is configured to replace at least one of normal memory cells connected to the failed column of the failed segment with at least one corresponding spare memory cell connected to the at least one spare in response to the column address replacement control signal.

According to another example embodiment, there is provided a memory device including: a memory cell array including normal memory cells and spare memory cells arranged in rows and columns including normal columns including normal memory cells and at least two spare columns each including spare memory cells, wherein the rows are divided into a plurality of segments; a segment match determining circuit configured to compare a row address received at the memory device with row address information corresponding to a failed segment and to generate a load control signal; a first column match determining circuit configured to compare a first column address information corresponding to a first failed column in response to the load control signal with a first column address received at the memory device and to generate a first column address replacement control signal; and a second column match determining circuit configured to compare a second column address information corresponding to a second failed column in response to the load control signal with a second column address received at the memory device and to generate a second column address replacement control signal, wherein the memory device is configured to replace at least one of normal memory cells connected to the first failed column of the failed segment with at least one corresponding spare memory cell connected to a first spare column of the at least two spare columns in response to the first column address replacement control signal, or at least one of the normal memory cells connected to the second failed column of the failed segment with at least one corresponding spare memory cell connected to a second spare column of the at least two spare columns in response to the second column address replacement control signal.

According to further example embodiment, there is provided a memory device including: a memory cell array including normal memory cells and spare memory cells arranged in a matrix of rows and columns including normal columns including normal memory cells and at least one spare column including spare memory cells, wherein the rows divided into an n segments, n being a natural number; a first repair circuit configured to generate a first segment repair signal in response to row address information corresponding to a failed segment; a second repair circuit configured to generate a first column repair signal in response to the first segment repair signal and a column address information corresponding to a failed column; and a column decoder configured to replace one of the normal memory cells located in the failed column of the failed segment with one of the spare memory cells located in the at least one spare column in response to the first column repair signal, wherein each of the n segments and the columns is selected in response to a row address and a column address, respectively.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
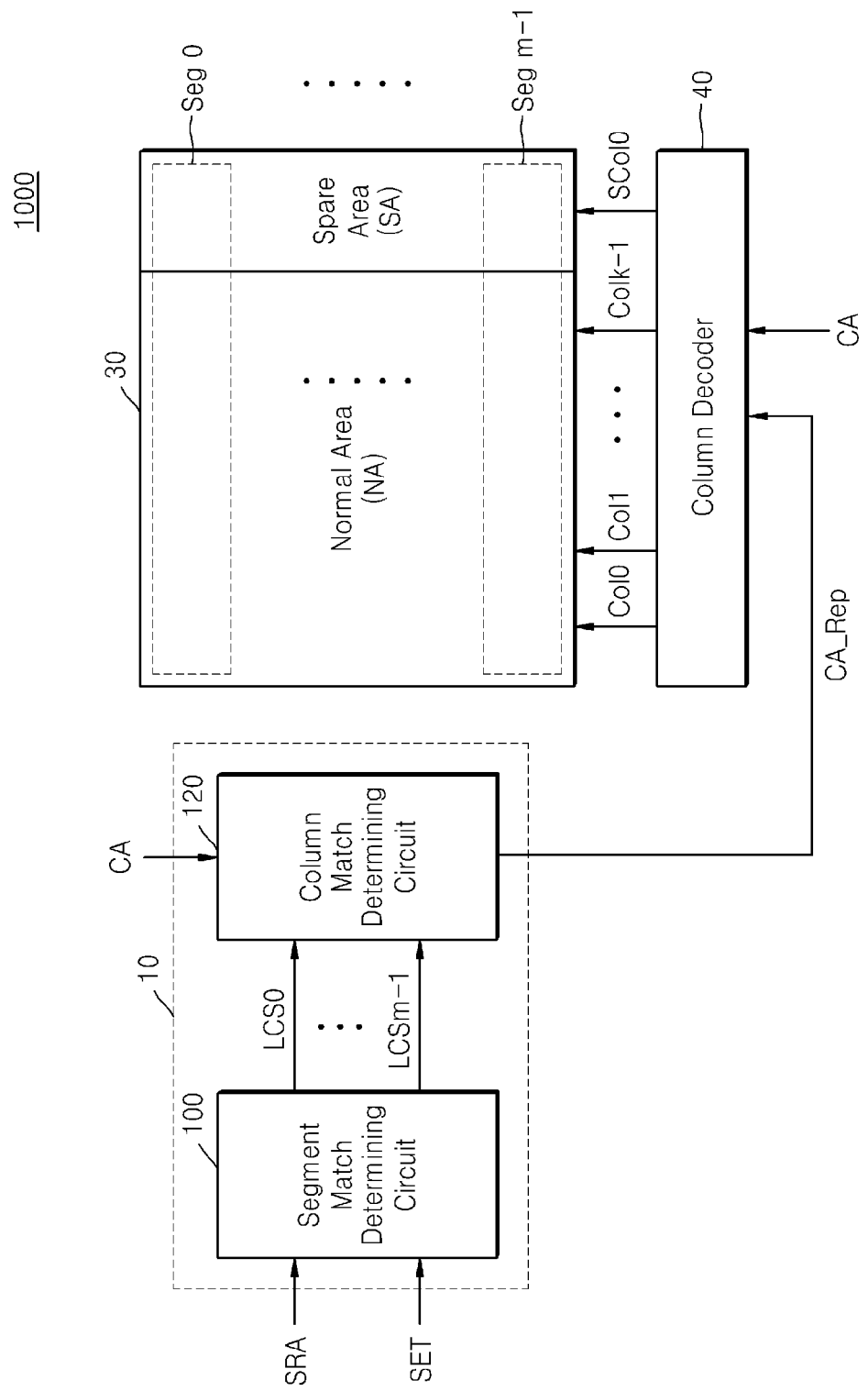
FIG. 1 is a block diagram of a memory device according to an embodiment.

Hereinafter, exemplary embodiments will be described more fully with reference to the accompanying drawings. The disclosure may, however, be embodied in many different forms and should not be construed as limited to the exemplary embodiments set forth herein. Like reference numerals denote like elements throughout the drawings. In the drawings, the lengths and sizes of layers and regions may be exaggerated for clarity.

The terminology used herein is for the purpose of describing particular embodiments only and is not intended to be limiting of the inventive concept. As used herein, the singular forms 'a', 'an', and 'the' are intended to include the plural forms as well, unless the context clearly indicates otherwise. It will be further understood that the terms such as "comprises" "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Expressions such as "at least one of," when preceding a list of elements, modify the entire list of elements and do not modify the individual elements of the list.

A memory capacity of a memory device, for example, dynamic RAM (DRAM), is scaled as 1 Gb, 2 Gb, 4 Gb, and 8 Gb based on $2^i$ (where i is the number of addresses). A highly integrated memory device is manufactured in order to increase the memory capacity of the DRAM through continuous scaling, and thus manufacturing processes of the DRAM are increasingly subdivided. As manufacturing processes of the DRAM are subdivided, hard or soft defective memory cells, hereinafter, referred to as defective cells, also increase. In this regard, hard defective cells are memory cells having permanent defects, and soft defective cells have minor defects and thus are temporarily defective memory cells. A repair method of replacing defective cells with spare cells separately from normal cells is employed as a method of repairing defective cells so as to secure a full memory capacity of the DRAM. For example, a method of replacing rows including defective cells with spare rows (a row repair) or a method of replacing columns including defective cells with spare columns (a column repair) is employed. Furthermore, a method of dividing rows including defective cells or columns including defective cells into a plurality of segments (hereinafter referred to as fail segments) and replacing the rows or columns with spare rows or spare columns in units of the segments is employed.

For convenience of description, an example of a case where a memory device including a repair circuit according to an embodiment of the present disclosure includes a DRAM will be described below. However, this is merely exemplary, and the memory device according to an embodiment of the disclosure is not limited to the DRAM. The memory device according to an embodiment of the disclosure may include resistive RAM (RRAM), phase RAM (PRAM), magnetic RAM (MRAM), or spin transfer torque MRAM (STT-MRAM). An example of a case where the repair circuit according to an embodiment of the disclosure repairs a defective cell by using the above described segment unit column repair method will be described below. However, this is merely exemplary, and the technical idea of the disclosure may apply to a case where a defective cell is repaired by using the above described segment unit row repair method.

FIG. 1 is a block diagram of a memory device 1000 according to an embodiment.

Referring to FIG. 1, the memory device 1000 may include a repair circuit 10, a memory cell array 30, and a column decoder 40.

The repair circuit 10 divides rows of the memory cell array 30 into an m number (where m is a natural number equal to or greater than 2) of segments Seg0, . . . , Segm−1 in a column direction, and performs a column repair operation in a unit of the segments Seg0, . . . , Segm−1. In more detail, defective cells in which error bits occurred are repaired by replacing columns connected to the defective cells with spare columns in segments in which the error bits occurred (hereinafter referred to as fail segments) among the segments Seg0, . . . , Segm−1. The rows of the memory cell array 30 may be divided by addressing the segments Seg0, . . . , Segm−1, separately from a row address (RA, not shown) of a memory cell that is to be accessed. Location information of the segments Seg0, . . . , Segm−1, i.e. a segment row address SRA, may be set as bits separately from the row address (RA, not shown), or may be set as some bits of the row address (RA, not shown). Fail segment row address information (FSRAI, not shown) indicating location information of fail segments of the segments Seg0, . . . , Segm−1 may also be set corresponding to the segment row address SRA. Meanwhile, the number of the segments Seg0, . . . , Segm−1 may be set in various ways according to a test result regarding whether memory cells fail. Also, sizes of the segments Seg0, . . . , Segm−1, i.e. the number of rows of the segments Seg0, . . . , Segm−1, may be set in such a way that the segments Seg0, . . . , Segm−1 are the same as or different from each other. An example of a case where one fail column in which at least one error bit occurs exists for each of the segments Seg0, . . . , Segm−1 will now be described with reference to FIGS. 1 through 9.

The repair circuit 10 may include a segment match determining circuit 100 and a column match determining circuit 120. The segment match determining circuit 100 loads the segment row address information (FSRAI, not shown) of at least one fail segment of the segments Seg0, . . . , Segm-1 in response to a set signal SET received from the outside, for example, a memory controller (not shown). In more detail, the segment match determining circuit 100 loads the segment row address information (FSRAI, not shown) of the least one fail segment if the set signal SET is activated, for example, logic high. For example, the set signal SET may activate the segment match determining circuit 100 when a user, a controller, or memory device needs to replace a failed memory cell in a failed segment with a spare memory cell in the failed segment. The segment match determining circuit 100 receives the segment row address SRA from the outside (e.g., from a controller). The segment match determining circuit 100 compares the segment row address SRA with the segment row address information (FSRAI, not shown) and determines whether a segment including a cell that is to be accessed (hereinafter referred to as an access segment) corresponds to a fail segment including defective cells. The segment match determining circuit 100 generates load control signals LCS0, . . . LCSm-1 used to control the column match determining circuit 120 to load fail column address information (FCAI, not shown) that will be described later according to a result of comparison. For example, if the access segment corresponds to the fail segment, i.e. if the access segment corresponds to one of the fail segments, the segment match determining circuit 100 generates the load control signals LCS0, . . . LCSm-1 of logic high levels for the corresponding fail segment. If no fail segment corresponds to the access segment, the segment match determining circuit 100 generates the load control signals LCS0, . . . LCSm-1 of logic low levels.

The column match determining circuit 120 loads the fail column address information (FCAI, not shown) of the fail segment in response to the load control signals LCS0, . . . LCSm-1 output by the segment match determining circuit 100. In more detail, the column match determining circuit 120 loads the fail column address information (FCAI, not shown) of the fail segment if one of the load control signals LCS0, . . . LCSm-1 is activated, for example, logic high. The column match determining circuit 120 receives a column address CA that is to be accessed (hereinafter referred to as an access column address CA) from the outside, for example, the memory controller (not shown). The access column address CA may be received at a memory device in a memory system. The column match determining circuit 120 compares the access column address CA with the fail column address information (FCAI, not shown) and determines whether a column connected to a cell that is to be accessed corresponds to a fail column. The column match determining circuit 120 generates a column address replacement control signal CA_Rep according to a result of comparison. For example, if the column connected to the cell that is to be accessed corresponds to the fail column, the column match determining circuit 120 generates the column address replacement control signal CA_Rep of a logic high level. In this case, the column decoder 40 that will be described later disables one of normal columns, Col0, . . . , Colk-1 corresponding to the access column address CA and enables a spare column Scol0 in response to the column address replacement control signal CA_Rep. If the column connected to the cell that is to be accessed does not correspond to the fail column, the column match determining circuit 120 generates the column address replacement control signal CA_Rep of a logic low level. The segment match determining circuit 100 and the column match determining circuit 120 will be described in more detail with reference to FIGS. 2 through 5.

The memory cell array 30 is divided into a normal cell array NA including a j*k number of normal cells respectively connected to cross points between a j number of rows and a k number of columns and a spare memory cell array SA including a plurality of spare cells connected to cross points between the j number of rows and an l number of spare columns. The normal cells are referred to as memory cells in which data is stored. The spare cells are referred to as memory cells that are replaced with defective cells among the normal cells and are accessed. For example, the normal cells are the cells that a controller attempts to use initially, before using spare memory cells. The normal cells and the spare cells may have, for example, a DRAM cell structure. As described above, the memory cell array 30 is divided into the segments Seg0, . . . , Segm-1 to repair defective cells by using the repair circuit 10, and thus defective cells of the normal cell array NA are repaired as spare cells of the spare memory cell array SA in fail segments among the segments Seg0, . . . , Segm-1. An example of a case where the spare memory cell array SA includes one spare column will now be described with reference to FIGS. 1 through 9 for convenience of description.

The column decoder 40 may disable one of normal columns, Col0, . . . , Colk-1 corresponding to the access column address CA that is an address signal of a memory cell that is to be accessed and enables a spare column Scol0 if the column address replacement control signal CA_Rep provided by the column match determining circuit 120 is activated, i.e. logic high. The column decoder 40 may enable a column corresponding to the access column address CA if the column address replacement control signal CA_Rep is inactivated since the access segment does not correspond to the fail segment or the column connected to the cell that is accessed in the fail segment does not correspond to the fail column. Although not shown, the memory device 1000 may further include a row decoder. The row decoder (not shown) enables a row including a memory cell that is to be accessed corresponding to a row address of the memory cell (not shown). Accordingly, the memory device 1000 may write data in the memory cell that is to be accessed or read the data from the memory cell according to a write control signal or a read control signal provided by the memory controller (not shown) if the repair circuit 10 does not perform a segment unit row repair operation according to an embodiment.

Figure 2:
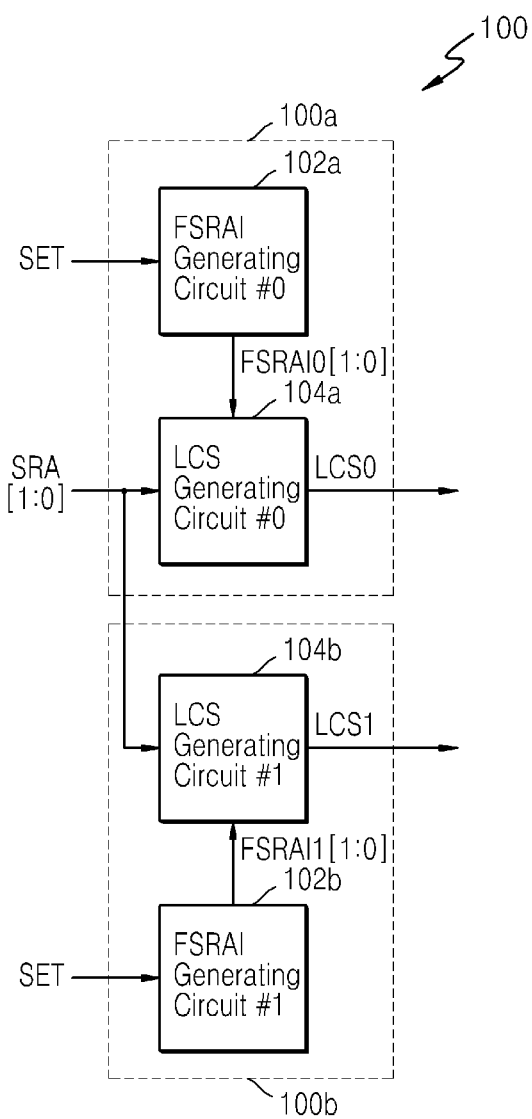
FIG. 2 is a block diagram of a segment match determining circuit of a repair circuit of FIG. 1 according to an embodiment.

FIG. 2 is a block diagram of the segment match determining circuit 100 of the repair circuit 10 of FIG. 1 according to an embodiment.

Referring to FIGS. 1 and 2, the segment match determining circuit 100 may include a first segment match determining circuit 100a and a second segment match determining circuit 100b. The first segment match determining circuit 100a may include a fail segment row address information generating circuit 102a and a load control signal generating circuit 104a. The second segment match determining circuit 100b may include a fail segment row address information generating circuit 102b and a load control signal generating circuit 104b. Although the segment match determining circuit 100 includes two fail segment row address information generating circuits 102a and 102b and two load control signal generating circuits 104a and 104b in FIG. 2, the disclosure is not limited thereto. Each of the number of the fail segment row address information generating circuit 102 and the load control signal generating circuit 104 may be less than a number of segments Seg0, . . . , Segm-1. Also, although each of the segment row address SRA and row address information FSRAI0, FSRAI1 of fail segments includes 2 bits in FIG. 2, the disclosure is not limited thereto. An example of a case where the segments Seg0, Seg1 correspond to fail segments, and each of the segment row address SRA and the row address information FSRAI0, FSRAI1 of fail segments includes 2 bits will now be described. FIG. 3 through 6 will be described later based on the assumption of the above example.

The fail segment row address information generating circuit 102a may store row address information FSRAI0[1:0] of the fail segment Seg0. The fail segment row address information generating circuit 102a may output the row address information FSRAI0[1:0] of the fail segment Seg0 to the load control signal generating circuit 104a in response to the activated set signal SET. The set signal SET may be set as a row address strobe signal provided by, for example, a memory controller (not shown). Alternatively, the set signal SET may be a signal set to output the row address information FSRAI0 [1:0] of the fail segment Seg0 from the fail segment row address information generating circuit 102a in a predetermined set period of time after the memory device 1000 is powered up.

The load control signal generating circuit 104a may receive a segment row address SRA[1:0] from the outside, for example, the memory controller (not shown). The load control signal generating circuit 104a may compare the segment row address SRA[1:0] with the row address information FSRAI0[1:0] and generate the load control signal LCS0 of logic high level or logic low level according to a result of the comparison. The load control signal LCS0 may be used by the column match determining circuit 120 to control a fail column address information generating circuit 122a (see FIG. 4) to output fail column address information that will be described later.

The fail segment row address information generating circuit 102b may store row address information FSRAI1[1:0] of the fail segment Seg1. The fail segment row address information generating circuit 102b may output the row address information FSRAI1[1:0] of the fail segment Seg1 to the load control signal generating circuit 104b in response to the activated set signal SET.

The load control signal generating circuit 104b may receive the segment row address SRA[1:0] from the outside, for example, the memory controller (not shown). The load control signal generating circuit 104b may compare the segment row address SRA[1:0] with the row address information FSRAI1[1:0] and generate the load control signal LCS1 of logic high level or logic low level according to a result of comparison. The load control signal LCS1 may be used by the column match determining circuit 120 to control a fail column address information generating circuit 122b (see FIG. 4) to output fail column address information that will be described later.

Figure 3A:
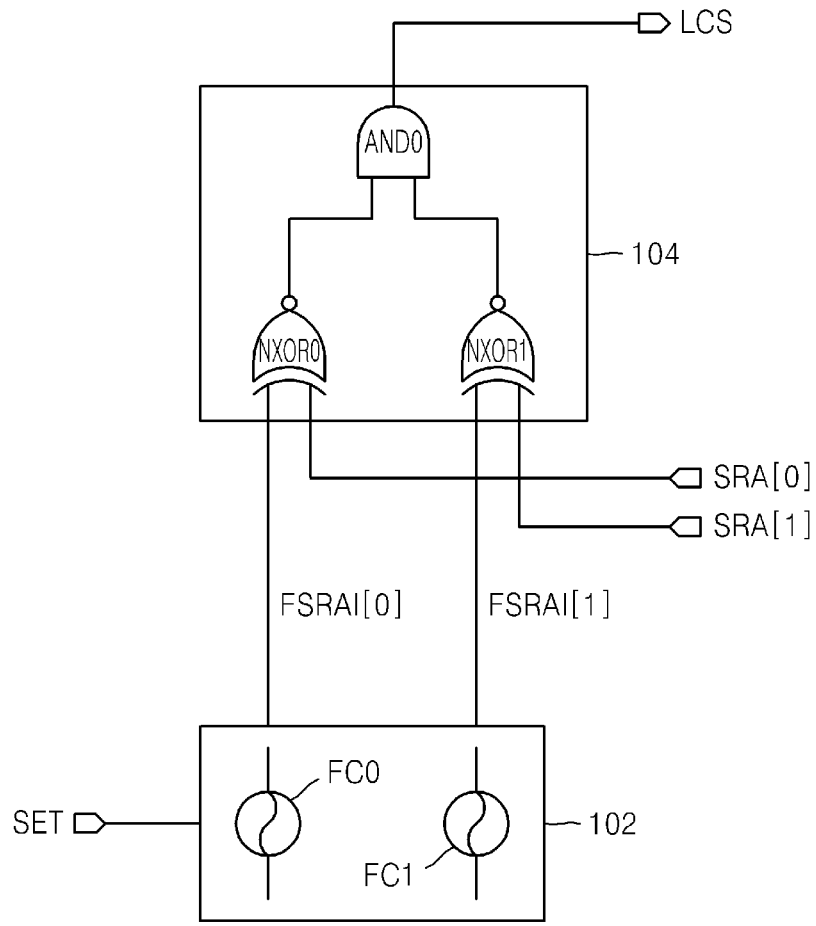
FIG. 3A is a detailed circuit diagram of a segment match determining circuit of FIG. 2, according to an embodiment.
Figure 3B:
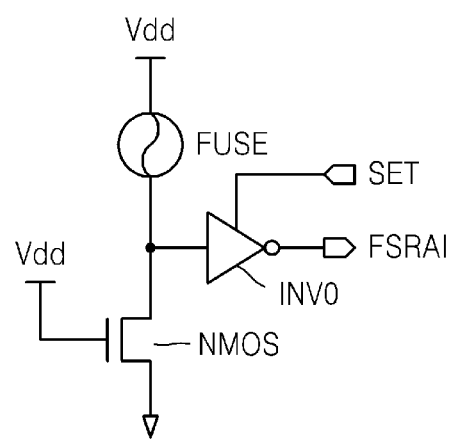
FIG. 3B is a detailed circuit diagram of a fuse circuit included in a fail segment row address information generating circuit of FIG. 3A, according to an embodiment.

FIG. 3A is a detailed circuit diagram of the segment match determining circuit 100 of FIG. 2, specifically, each of the first and second segment match determining circuits 100a and 100b, according to an embodiment. FIG. 3B is a detailed circuit diagram of a fuse circuit FC included in the fail segment row address information generating circuit 102 of FIG. 3A, according to an embodiment.

Referring to FIGS. 2, 3A, and 3B, the fail segment row address information generating circuit 102 may include two fuse circuits FC0 and FC1 corresponding to the number of bits (2 bits) included in the segment row address information FSRAI of fail segments. Each of the fuse circuit FC0 and FC1 may include a fuse FUSE, an NMOS transistor NMOS, and an inverter INV0 (see FIG. 3B). The fuse FUSE may be connected to a power voltage source Vdd and a drain terminal of the NMOS transistor NMOS. The power voltage source Vdd may be connected to a gate terminal of the NMOS transistor NMOS and a ground terminal may be connected to a source terminal thereof. The inverter INV0 may be connected to a drain terminal of the NMOS transistor NMOS, receive the set signal SET, and invert and output an output of the NMOS transistor NMOS.

The fuse circuits FC0 and FC1 may respectively store one bit value included in the segment row address information FSRAI of fail segments through a cutting status of the fuse FUSE, and output the stored one bit value in response to the set signal SET. When the fuse FUSE is cut, since the output of the NMOS transistor NMOS is logic low, if the set signal SET is activated, the inverter INV0 may invert the output of the NMOS transistor NMOS and the fuse circuits FC0 and FC1 may output having a logic high level. When the fuse FUSE is not cut, since the output of the NMOS transistor NMOS is logic high, if the set signal SET is activated, the inverter INV0 may invert the output of the NMOS transistor NMOS and the fuse circuits FC0 and FC1 may output having a logic low level.

As described above, the fail segment row address information generating circuit 102 may store bit values FSRAI[0], FSRAI[1] included in the row address information FSRAI of fail segments in the two fuse circuits FC0, FC1, and output the bit values FSRAI[0], FSRAI[1] from the two fuse circuits FC0, FC1 in response to the activated set signal SET.

The load control signal generating circuit 104 may include two NXOR gates NXOR0, NXOR1 and an AND Gate AND0. The NXOR gate NXOR0 may receive and compare outputs of the fuse circuit FC0, i.e. the bit value FSRAI[0] included in the row address information FSRAI of fail segments and the bit value SRAI[0] included in the segment row address SRA and output a comparison result value to the AND gate AND0. The NXOR gate NXOR1 may receive and compare outputs of the fuse circuit FC1, i.e. the bit value FSRAI[1] included in the row address information FSRAI of fail segments and the bit value SRAI[1] included in the segment row address SRA and output a comparison result value to the AND gate AND0.

The AND gate AND0 may input the output values of the NXOR gates NXOR0, NXOR1 and generate the load control signal LCS. For example, if the output values of the NXOR gates NXOR0, NXOR1 are all logic high level, i.e. if they are the same as logic high level according to the comparison results by the NXOR gates NXOR0, NXOR1, the AND gate AND0 may generate the load control signal LCS of a logic high level. If the output values of the NXOR gates NXOR0, NXOR1 are not all logic high, i.e. if they are not the same according to the comparison result by any one of the NXOR gates NXOR0, NXOR1, the AND gate AND0 may generate the load control signal LCS having a logic low level.

As described above, the load control signal generating circuit 104 may compare the row address information FSRAI of fail segments with the segment row address SRA, and generate the load control signal LCS used to control whether the column match determining circuit 120 loads the fail column address information FCAI according to a result of the comparison.

Figure 4:
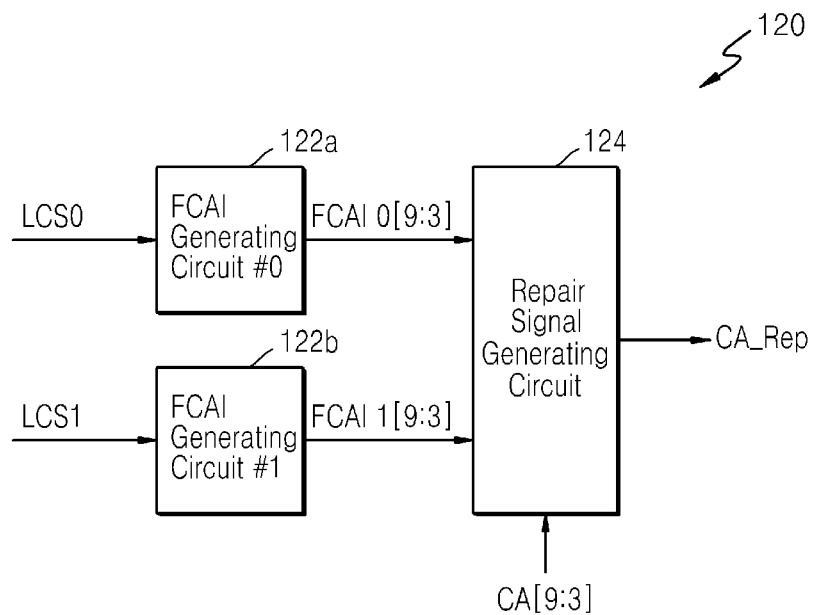
FIG. 4 is a block diagram of a column match determining circuit of a repair circuit of FIG. 1 according to an embodiment.

FIG. 4 is a block diagram of the column match determining circuit 120 of the repair circuit 10 of FIG. 1 according to an embodiment.

Referring to FIGS. 1 and 4, the column match determining circuit 120 may include a fail column address information generating circuits 122a and 122b and a repair signal generating circuit 124. Although the column match determining circuit 120 includes the two fail column address information generating circuits 122a and 122b in FIG. 4, the disclosure is not limited thereto. Each of a number of the fail column address information generating circuits 122a and 122b may be smaller than or equal to the number of the segments Seg0, . . . Segm–1. For example, each of the number of the fail column address information generating circuits 122a and 122b may correspond to the number of fail segments among the segments Seg0, . . . Segm–1. Also, although each of the access column address CA and fail column address information FCAI0, FCAI1 includes 7 bits in FIG. 4, the disclosure is not limited thereto. An example of a case where each of the access column address CA and fail column address information FCAI0, FCAI1 includes 7 bits will now be described. FIG. 5 through 12 will be described later based on the assumption of the above example.

The fail column address information generating circuit 122a may receive the load control signals LCS0 from the load control signal generating circuit (102a, see FIG. 2) corresponding to the segment match determining circuit 100. If the load control signal LCS0 is activated to a logic high level, the fail column address information generating circuit 122a may output fail column address information FCAI0[9:3] in the corresponding fail segment Seg0 to the repair signal generating circuit 124.

The fail column address information generating circuit 122b may receive the load control signals LCS1 from the load control signal generating circuit (102b, see FIG. 2) corresponding to the segment match determining circuit 100. If the load control signal LCS1 is activated to a logic high level, the fail column address information generating circuit 122b may output fail column address information FCAI1[9:3] in the corresponding fail segment Seg1 to the repair signal generating circuit 124. Although two separate groups of lines are shown in FIG. 4, in one embodiment, the fail column address information FCAI0[9:3] and FCAI1[9:3] may be commonly connected to one group of lines, and may be commonly input to the repair signal generating circuit 124.

The repair signal generating circuit 124 may compare the fail column address information FCAI0[9:3] output by the fail column address information generating circuit 122a with an access column address CA[9:3] or may compare the fail column address information FCAI1[9:3] output by the fail column address information generating circuit 122b with the access column address CA[9:3]. The repair signal generating circuit 124 may generate the column address replacement control signal CA_Rep having a logic high level or a logic low level according to a result of each comparison.

Figure 5A:
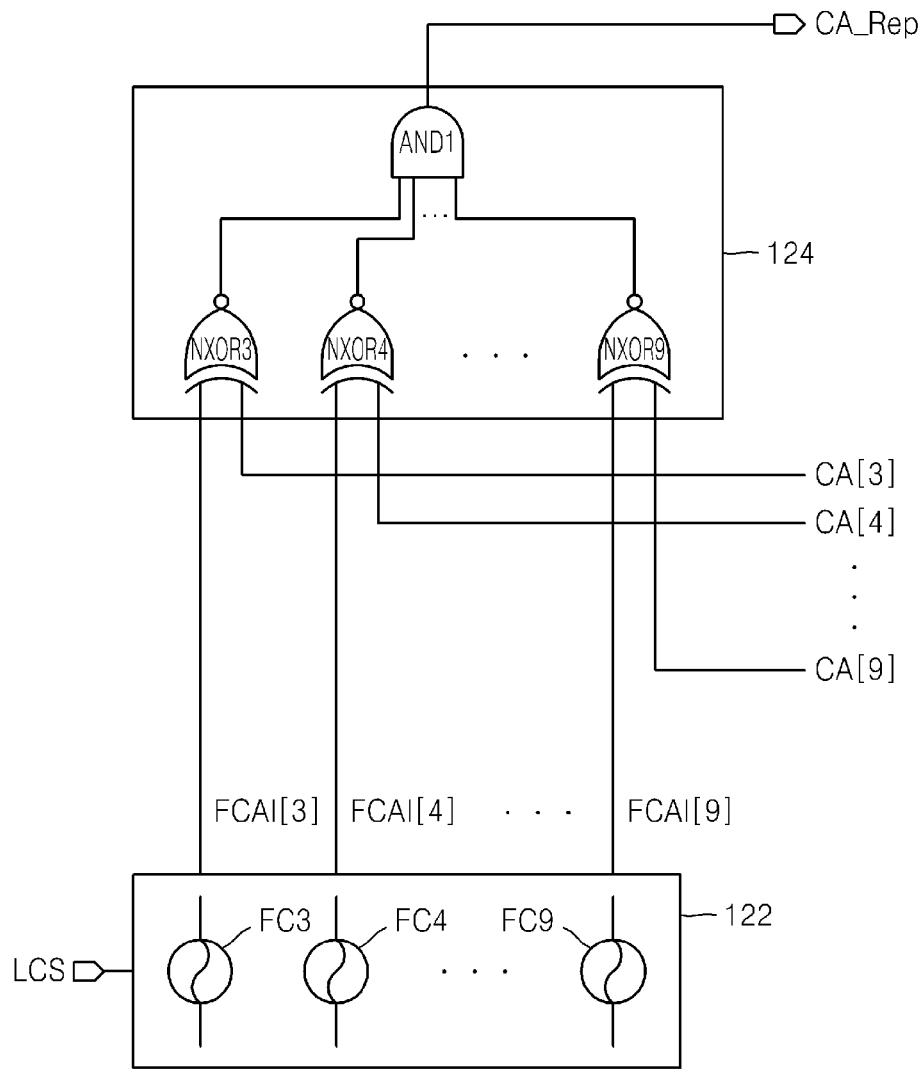
FIG. 5A is a detailed circuit diagram of the column match determining circuit of FIG. 4, according to an embodiment.
Figure 5B:
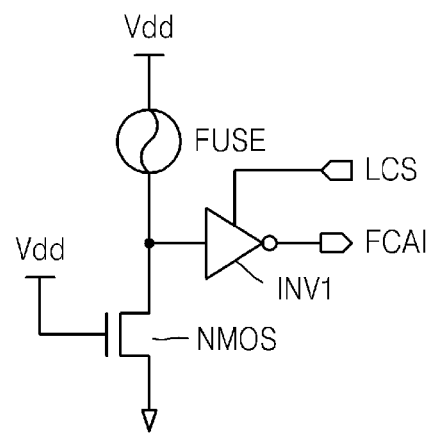
FIG. 5B is a detailed circuit diagram of a fuse circuit included in a fail column address information generating circuit of FIG. 5A, according to an embodiment.

FIG. 5A is a detailed circuit diagram of the column match determining circuit 120 of FIG. 4, specifically, each of the fail column address information generating circuits 122a and 122b, according to an embodiment. FIG. 5B is a detailed circuit diagram of the fuse circuit FC included in the fail column address information generating circuit 122 of FIG. 5A, according to an embodiment. Regarding the constructions of FIGS. 5A and 5B that are the same as described with reference to FIGS. 3A and 3B, operations thereof are also the same or similar, and thus redundant descriptions thereof will be omitted here.

Referring to FIGS. 4, 5A, and 5B, the fail column address information generating circuit 122 may include seven fuse circuits FC3, . . . , FC9 corresponding to the number of bits (7 bits) included in the fail column address information FCAI. The fuse circuits FC3, . . . , FC9 has the same construction as each of the fuse circuits FC0 and FC1 shown in FIG. 3 except that the load control signals LCS is applied to an inverter INV1. Thus, each of the fuse circuits FC3, . . . , FC9 may respectively store one bit value included in the fail column address information FCAI according to a cut status of the fuse FUSE, and output the stored one bit value in response to the load control signal LCS.

As described above, the fail column address information generating circuit 122 may store bits values FCAI[3], . . . , FCAI[9] included in the fail column address information FCAI in the seven fuse circuits FC3, . . . , FC9, and may respectively output the bits values FCAI[3], . . . , FCAI[9] from the seven fuse circuits FC3, . . . , FC9 in response to the activated load control signal LCS.

The repair signal generating circuit 124 may include seven NXOR gates NXOR3, . . . , NXOR9 and an AND Gate AND1. The NXOR gates NXOR3, . . . , NXOR9 may receive and compare outputs of the corresponding fuse circuits FC3, . . . , FC9 and bit values CA[3], . . . , CA[9] included in the access column address CA, and output comparison result values to the AND gate AND1.

The AND gate AND1 may input the output values of the NXOR gates NXOR3, . . . , NXOR9 and generate the column address replacement control signal CA_Rep. For example, if outputs of the NXOR gates NXOR3, . . . , NXOR9 are the same logic high level according to the comparison results by the NXOR gates NXOR3, . . . , NXOR9, the AND gate AND1 may generate the column address replacement control signal CA_Rep having a logic high level. If outputs of the NXOR gates NXOR3, . . . , NXOR9 are not the same logic high level according to the comparison result by any one of the NXOR gates NXOR3, . . . , NXOR9, the AND gate AND1 may generate the column address replacement control signal CA_Rep having a logic low level.

As described above, the repair signal generating circuit 124 may compare the fail column address information FCAI with the access column address CA, and generate the column address replacement control signal CA_Rep used to control whether the column decoder 40 disables a normal column corresponding to the access column address CA and enables a spare column according to a result of the comparison.

Figure 6:
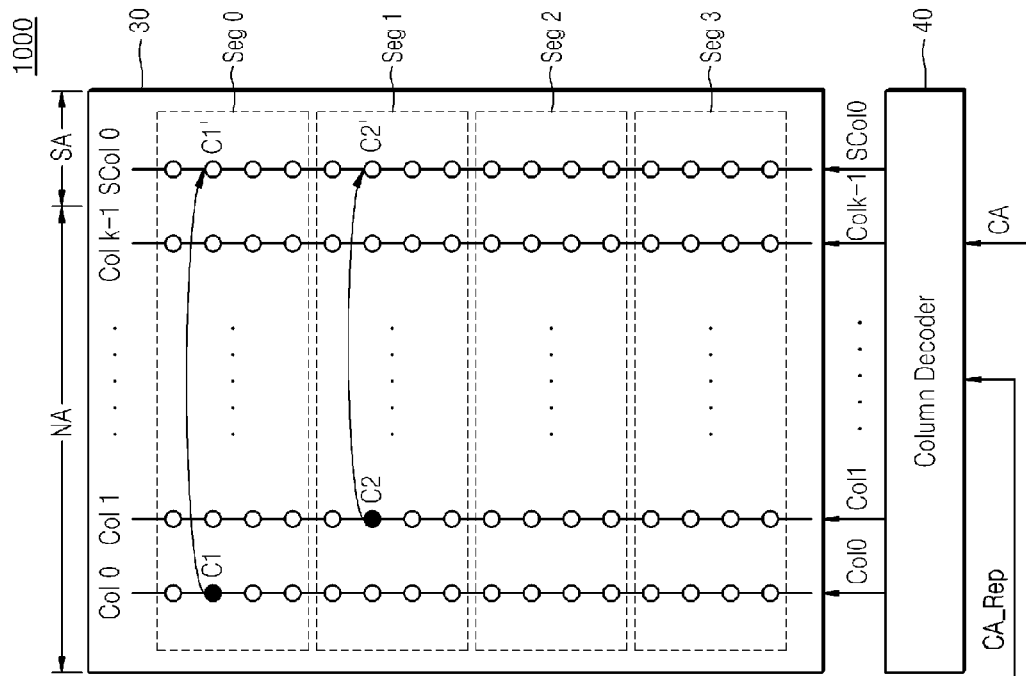
FIG. 6 is a diagram of the memory device of FIG. 1 that repairs defective cells, according to an embodiment.
Figure 6:
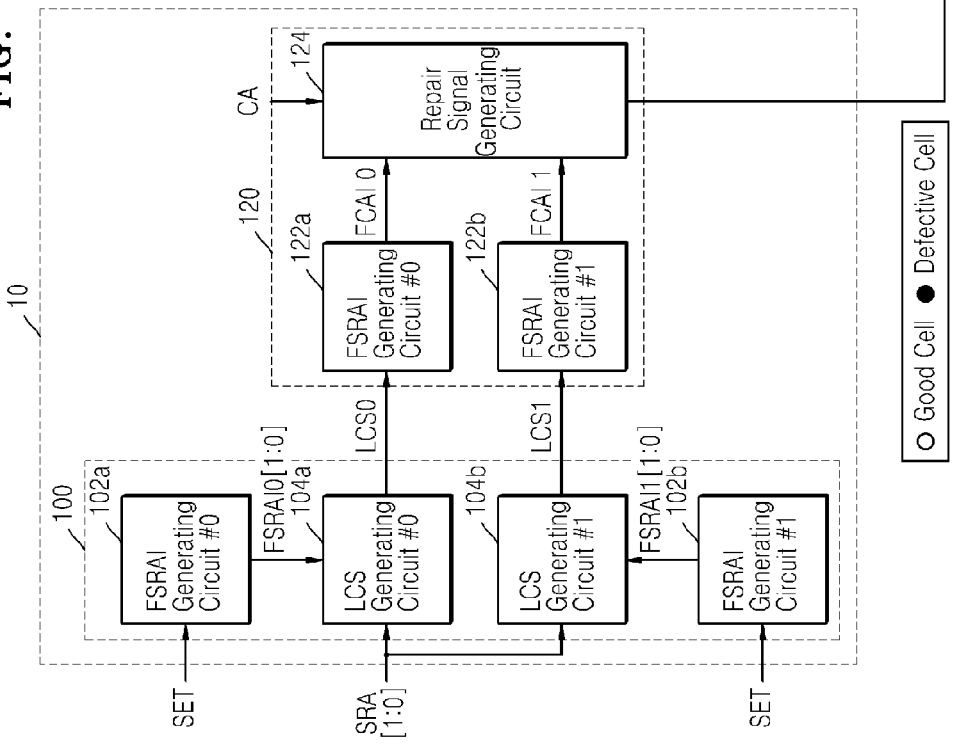

FIG. 6 is a diagram of the memory device 1000 of FIG. 1 that repairs defective cells C1, C2, according to an embodiment. In FIG. 6, the memory cell array 30 is divided into the four segments Seg0, . . . , Seg3 in a column direction. The memory cell array 30 includes defective cells in black circles and good cells in white circles (the same applies to FIGS. 9 through 12). Regarding the constructions of the memory device 1000 of FIG. 6 that are the same as described with reference to FIG. 1, operations thereof are also the same or similar, and thus redundant descriptions thereof will be omitted here.

Referring to FIGS. 1 through 6, the normal memory cell array NA of the memory cell array 30 includes a 16*k number of normal cells respectively connected to cross points between sixteen rows and a k number of columns Col0, . . . , Colk–1. The spare memory cell array SA of the memory cell array 30 includes sixteen spare cells respectively connected to cross points between the sixteen rows and one spare column SCol0.

Location information regarding the defective cells C1, C2 of the memory cell array 30 is obtained through a predetermined test regarding whether an error bit occurs during an operation of manufacturing the memory device 1000. Location information regarding a segment among the location information regarding defective cells C1 and C2 stores in the fail segment row address information generating circuits 102a and 102b as the row address information FSRAI0, FSRAI1 of the fail segments Seg0, Seg1 during the manufacturing the memory device 1000. Location information regarding a column among the location information regarding the defective cells C1 and C2 may store in the fail column address information generating circuits 122a and 122b as the fail column address information FCAI0, FCAI1 during the manufacturing the memory device 1000.

To access memory cells of the normal memory cell array NA after the memory device 1000 operates, if control signals, for example, write or read control signals (not shown), are applied to the memory device 1000, the set signal SET is activated and is applied to the segment match determining circuit 100. In response to the activate set signal SET, the fail segment row address information generating circuits 102a and 102b respectively output the row address information FSRAI0, FSRAI1 of the fail segments Seg0, Seg1 to the corresponding load control signal generating circuits 104a and 104b.

In a case where the defective cell C1 is accessed, row address of the fail segment Seg0 that is accessed is applied to the load control signal generating circuits 104a and 104b. Each of the load control signal generating circuits 104a and 104b compares each of the row address of the fail segments Seg0 and Seg1, respectively, that is accessed with the row address information FSRAI0 and FSRAI1 of the fail segments Seg0 and Seg1, respectively. If they are the same as a result of the comparison, the load control signal generating circuit 104a outputs the activated load control signal LCS0 to the fail column address information generating circuit 122a. The fail column address information generating circuit 122a outputs the fail column address information FCAI0 of the fail segment Seg0 to the repair signal generating circuit 124 in response to the activated load control signal LCS0. The repair signal generating circuit 124 receives a column address CA0 of the defective cell C1 and compares the column address CA0 with the fail column address information FCAI0. If they are the same according to a result of the comparison, the repair signal generating circuit 124 activates and outputs the column address replacement control signal CA_Rep to the column decoder 40. The column decoder 40 disables a normal column corresponding to the column address CA0 of the defective cell C1 and enables a spare column in response to the activated column address replacement control signal CA_Rep. Thus, if the defective cell C1 is accessed, the defective cell C1 is replaced with a spare cell C1' of the spare memory cell array SA by accessing the spare cell C1', instead of the defective cell C1.

In the same manner as the defective cell C1 is accessed, if the defective cell C2 is accessed, the load control signal generating circuit 104b activates and outputs the load control signal LCS1. The fail column address information generating circuit 122b outputs the fail column address information FCAI1 of the fail segment Seg1 to the repair signal generating circuit 124 in response to the activated load control signal LCS1. The repair signal generating circuit 124 receives a column address CA1 of the defective cell C2 and compares the column address CA1 with the fail column address information FCAI1. If they are the same according to a result of the comparison, the repair signal generating circuit 124 activates and outputs the column address replacement control signal CA_Rep to the column decoder 40. Thus, the defective cell C2 is replaced with a spare cell C2'. Although two separate groups of lines are shown in FIG. 6, the fail column address information FCAI0 and FCAI1 may be commonly connected to one group of lines, and may be commonly input to the repair signal generating circuit 124.

The memory device 1000 according to an embodiment divides and repairs defective cells that occur in the memory cell array 30 in units of segments in a column direction, and thus a greater number of defective cells may be repaired with the minimum numbers of spare columns and spare cells, thereby further enhancing repair efficiency and data reliability. The memory device 1000 according to the embodiment does not need a great number of fuse circuits to store location information of defective cells for each of the segments, and thus a mass storage and compact memory device may be implemented.

Figure 7:
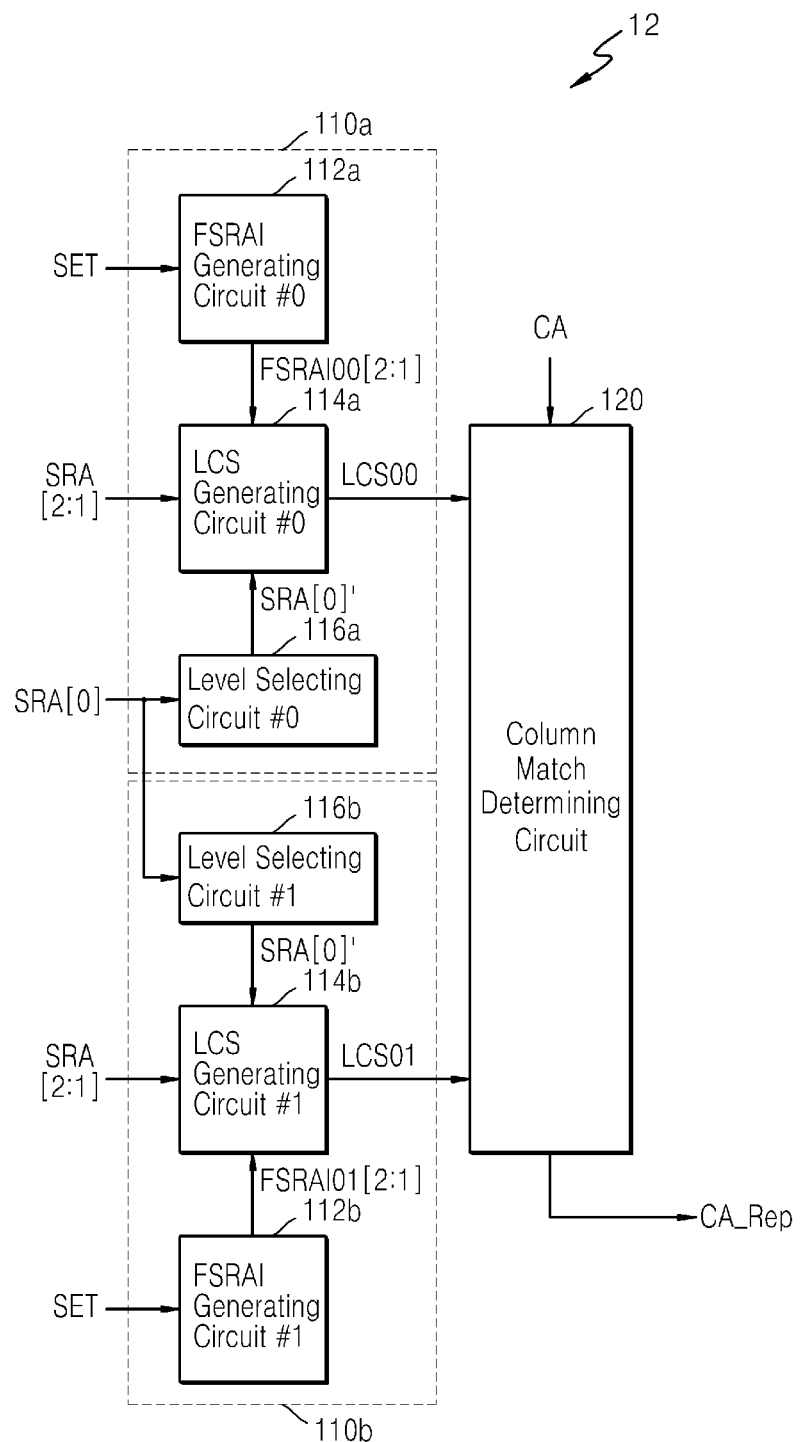
FIG. 7 is a block diagram of a repair circuit of FIG. 1, according to an embodiment.

FIG. 7 is a block diagram of a repair circuit 12 of FIG. 1, according to an embodiment. Fail segment row address information generating circuits 112a and 112b, load control signal generating circuits 114a and 114b, and the column match determining circuit 120 are the same as or similar to those described with reference to FIGS. 1 through 6 in terms of constructions and operations, and thus redundant descriptions thereof will be omitted here, and the segment match determining circuit 110 will now be described.

Referring to FIG. 7, the segment match determining circuit 110 may include a first segment match determining circuit 110a and a second segment match determining circuit 110b. Each of the segment match determining circuits 110a and 110b may further include level selecting circuits 116a and 116b, respectively. Each of the level selecting circuits 116a and 116b may receive some of bits included in the segment row address SRA of an access segment. Some bits may be determined from location information of error bits that are determined through a predetermined test regarding whether error bits occur as described above. In more detail, in a case where defective cells are located in the same segment or neighboring segments as a result of the test, fixable bits may be determined from row address information of a fail segment. Bits of the segment row address SRA of the access segment corresponding to the fixable bits may be set to be applied to the level selecting circuits 116a and 116b. For example, in a case where row addresses of the segments Seg0, . . . , Seg3 are respectively set as "00", "01", "10", and "11", and defective cells exist only in the segments Seg0 and Seg1, since a most significant bit "0" among row addresses of the fail segments Seg0, Seg1 may be fixed, a most significant bit SRA[0] among the segment row address SRA of the access segment may be set to be applied to the level selecting circuits 116a and 116b. Meanwhile, in the above example, a next significant bit SRA[2] may be allocated to a segment row address SRA[2:1] of the access segment to maintain 2 bits. Also, the next significant bit SRA[2] may be allocated to the row address information FSRAI1 of the fail segment Seg1 to maintain 2 bits so that the row address information FSRAI1 may be stored in the fail segment row address information generating circuits 112a and 112b during the manufacturing the memory device. The number of the level selecting circuits 116a and 116b may correspond to the number of fixed bits. For example, in a case where the number of bits included in row address information of segments is 3 or more, and 1 or more bits may be fixed in row address information of fail segments in which defective cells occur, the number of the level selecting circuits 116a and 116b may be 2 or more. The level selecting circuits 116a and 116b may fix a logic level of the most significant bit SRA[0] among the segment row address SRA of the received access segment and output the most significant bit SRA[0] to the load control signal generating circuits 114a and 114b, respectively.

The load control signal generating circuits 114a and 114b may receive outputs SRA[0]' of the level selecting circuits 166a and 166b and the segment row address SRA[2:1] of the access segment, compare the outputs SRA[0]' and the segment row address SRA[2:1] with row address information FSRAI00[2:1], FSRAI01[2:1] of the fail segments Seg0, Seg1, and output load control signals LCS00, LCS01 to the column match determining circuit 120 according to a result of the comparison. Thus, the repair circuit 12 may subdivide segments and repair defective cells. This will be described in more detail with reference to FIG. 9.

Figure 8:
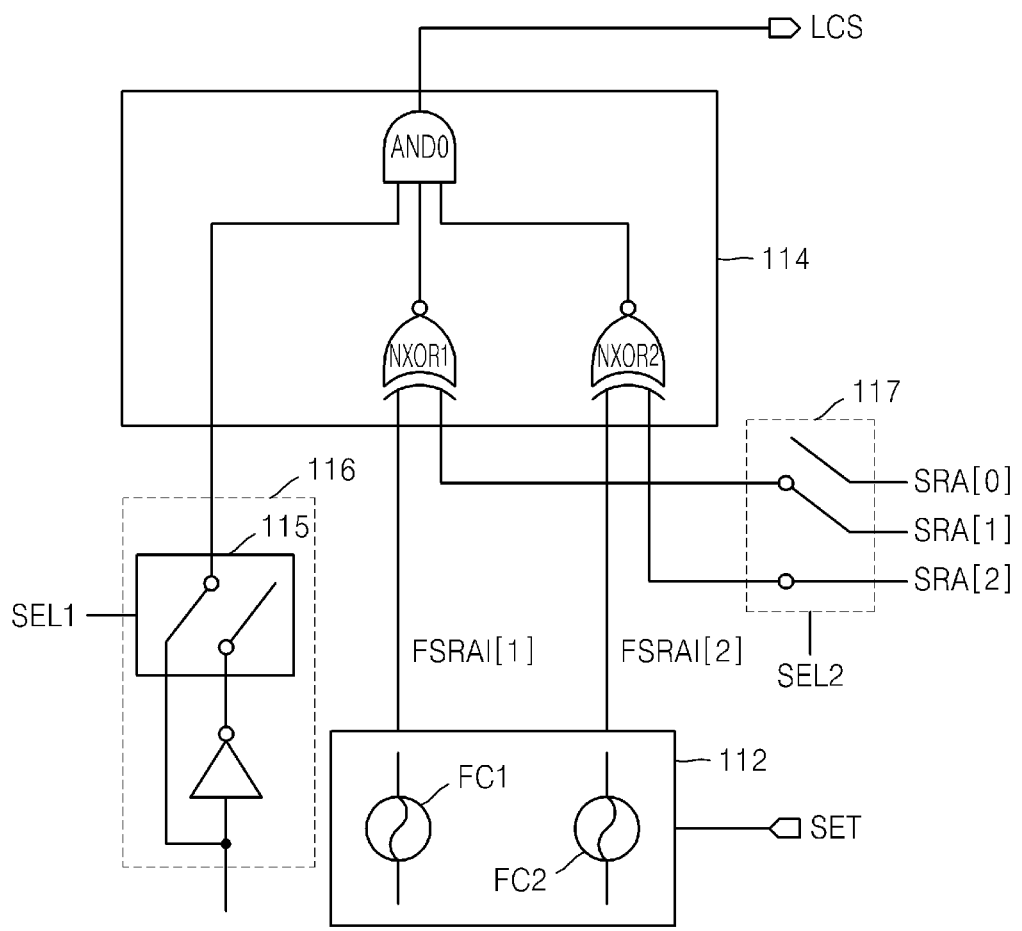
FIG. 8 is a detailed circuit diagram of a segment match determining circuit of the repair circuit of FIG. 7 according to an embodiment.

FIG. 8 is a detailed circuit diagram of the segment match determining circuit 110 of the repair circuit 12 of FIG. 7, specifically, each of the first and second segment match determining circuits 110a and 110b, according to an embodiment. Regarding the constructions of FIG. 8 that are the same as described with reference to FIGS. 3A and 3B, operations thereof are also the same or similar, and thus redundant descriptions thereof will be omitted here. Also, an example of a case where a bit among a segment row address of an access segment received by the level selecting circuit 116 is a single bit that is the most significant bit SRA[0] of bits included in the row address of the access segment will be described with reference to FIG. 8.

Referring to FIGS. 7 and 8, the level selecting circuit 116 may include at least one inverter and selector. The level selecting circuit 116 may operate with one inverter by a selector 115 in response to a first selection signal SEL1, for example, if the most significant bit SRA[0] is selected to logic low level. Alternatively, the level selecting circuit 116 may operate without the inverter by the selector 115, for example, if the most significant bit SRA[0] is selected to logic high level.

A selector 117 may select the next two significant bits of the SRA[0], i.e., SRA[1] and SRA[2] in response to a second selection signal SEL2. For example, the selector 117 may select the SRA[1] and SRA[2] by using one or more fuses.

The fail segment row address information generating circuit 112 may include the fuse circuit FC1 and a fuse circuit FC2, and output a bit FSRAI[1] and a bit FSRAI[2] included in fail segment row address information stored in the fuse circuits FC1 and FC2 to the load control signal generating circuit 114 in response to the activated set signal SET.

The load control signal generating circuit 114 may include the NXOR gate NXOR1 and an NXOR gate NXOR2 and the AND gate AND0. The NXOR gates NXOR1 and NXOR2 may respectively compare the bits FSRAI[1] and FSRAI[2] included in the fail segment row address information with bits SRA[1] and SRA[2] included in the row address of the access segment and output the comparison results to the AND gate AND0. The AND gate AND0 may input an output of the level selecting circuit 116 and outputs of the NXOR gates NXOR1 and NXOR2 and output the load control signal LCS.

Figure 9:
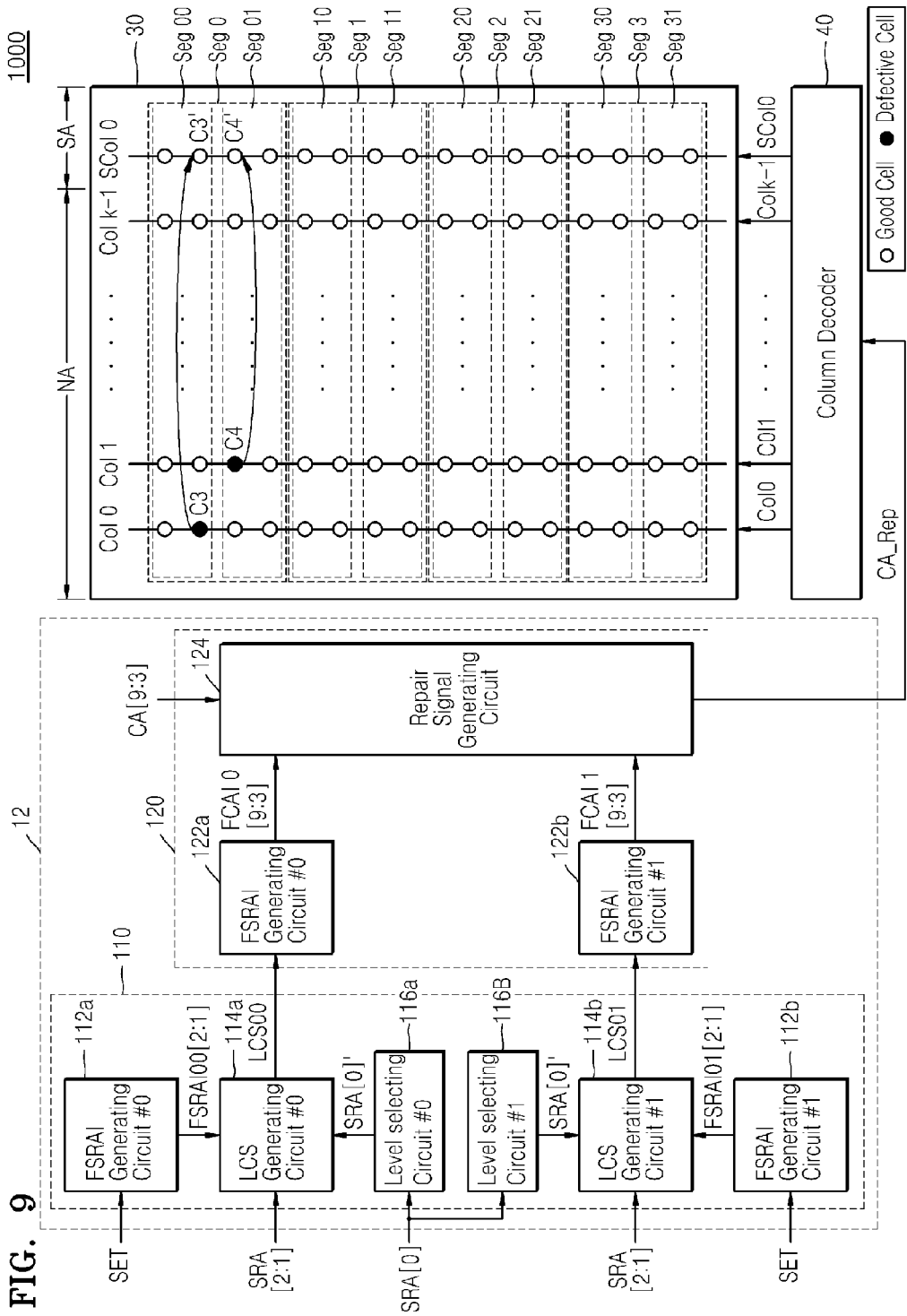
FIG. 9 is a diagram of the memory device of FIG. 1 including the repair circuit of FIG. 7 that repairs defective cells, according to another embodiment.

FIG. 9 is a diagram of the memory device 1000 including the repair circuit 12 of FIG. 7 that repairs defective cells C3, C4, according to another embodiment. In FIG. 9, the four segments Seg0, . . . , Seg3 of the memory cell array 30 are further subdivided into eight segments Seg00, Seg10, Seg11, Seg20, Seg21, Seg30, and Seg31 in a column direction. Regarding the constructions of FIG. 9 that are the same as described with reference to FIGS. 1, 6, and 7, operations thereof are also the same or similar, and thus redundant descriptions thereof will be omitted here.

Location information regarding the defective cells C3, C4 of the memory cell array 30 is obtained through a predetermined test regarding whether an error bit occurs during an operation of manufacturing the memory device 1000. Location information regarding a segment among the location information regarding the defective cells C3, C4 may store in the fail segment row address information generating circuits 112a and 112b as row address information FSRAI00, FSRAI01 of the fail segments Seg00, Seg01. Location information regarding a column among the location information regarding defective cells C3, C4 may store in the fail column address information generating circuits 122a and 122b as the fail column address information FCAI0, FCAI1. Although two separate groups of lines are shown in FIG. 9, the fail column address information FCAI0 and FCAI1 may be commonly connected to one group of lines, and may be commonly input to the repair signal generating circuit 124.

To access memory cells of the normal cell array NA during a test for the memory device 1000, if control signals, for example, write or read control signals (not shown), are applied to the memory device 1000, the set signal SET is activated and is applied to the segment match determining circuit 110. In response to the activate set signal SET, the fail segment row address information generating circuits 112a and 112b respectively output the row address information FSRAI0 and FSRAI1 of the fail segments Seg00 and Seg01 to the corresponding load control signal generating circuits 114a and 114b.

In a case where the defective cell C3 is accessed, row addresses of the fail segment Seg00 that is accessed may be applied to the load control signal generating circuit 114a. The level selecting circuit 116a may select logic low level of the most significant bit SRA[0] and output SRA[0]' to the load control signal generating circuit 114a. The operation of the level selecting circuit 116a is similar to the level selecting circuit 116a of FIG. 7, thus redundant descriptions thereof will be omitted here. The load control signal generating circuit 114a may compare row addresses of the fail segment Seg00 that is accessed with the row address information FSRAI00 of the loaded fail segments Seg00. If they are determined to be the same as a result of the comparison, the load control signal generating circuit 114a outputs the activated load control signal LCS00 to the fail column address information generating circuit 122a. The fail column address information generating circuit 122a outputs the fail column address information FCAI0 of the fail segment Seg00 to the repair signal generating circuit 124 in response to the activated load control signal LCS00. The repair signal generating circuit 124 receives the column address CA0 of the defective cell C3 and compares the column address CA0 with the fail column address information FCAI0. Since they are the same according to a result of the comparison, the repair signal generating circuit 124 activates and outputs the column address replacement control signal CA_Rep to the column decoder 40. The column decoder 40 disables a normal column Col0 of the defective cell C3 and enables a spare column Scol0 in response to the activated column address replacement control signal CA_Rep. Thus, if the defective cell C3 is accessed, the defective cell C3 is repaired by a space cell C3' of the spare cell array SA by accessing the spare cell C3', instead of the defective cell C3.

In the same manner as the defective cell C3 is accessed, if the defective cell C4 is accessed, the load control signal generating circuit 114b activates and outputs the load control signal LCS01. The fail column address information generating circuit 122b outputs the fail column address information FCAI1 of the fail segment Seg01 to the repair signal generating circuit 124 in response to the activated load control signal LCS01. The repair signal generating circuit 124 receives the column address CA1 of the defective cell C4 and compares the column address CA1 with the fail column address information FCAI1. Since they are the same according to a result of the comparison, the repair signal generating circuit 124 activates and outputs the column address replacement control signal CA_Rep to the column decoder 40. Thus, the defective cell C4 is repaired by a spare cell C4'.

The memory device 1000 including the repair circuit 12 according to the present embodiments further subdivides segments and repairs defective cells without further adding spare cells and fuse circuits and skipping defective cells, thereby implementing a mass storage and compact memory device, and enhancing data reliability. In particular, the memory device 1000 including the repair circuit 12 further enhances repair efficiency when defective cells locally occur in the memory cell array 30.

Figure 10:
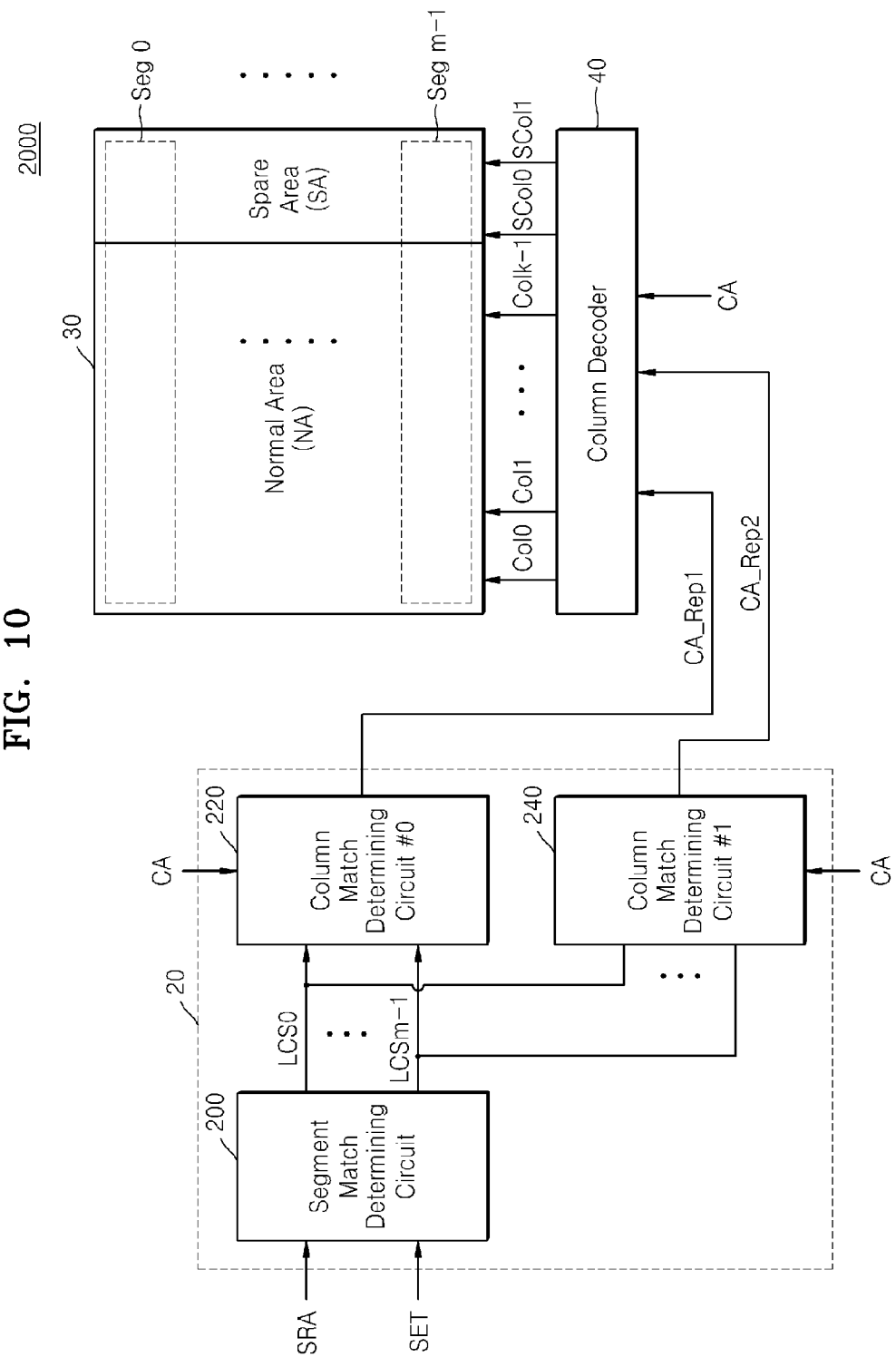
FIG. 10 is a block diagram of a memory device according to another embodiment.

FIG. 10 is a block diagram of a memory device 2000 according to another embodiment. Referring to FIG. 10, the memory device 2000 may include a repair circuit 20, the memory cell array 30, and the column decoder 40. A segment match determining circuit 200 of the repair circuit 20, the memory cell array 30, and the column decoder 40 of FIG. 10 are the same as or similar to those described with reference to FIG. 1 in terms of constructions and operations, and thus redundant descriptions thereof will be omitted here. Meanwhile, the memory cell array 30 of FIG. 10 further includes a spare column SCol1 in addition to the spare column SCol0. Furthermore, an example of a case where two fail columns exist for each of the segments Seg0, . . . , Segm−1 will be described with reference to FIGS. 10 through 12.

The repair circuit 20 includes the segment match determining circuit 100, a first column match determining circuit 220, and a second column match determining circuit 240. The segment match determining circuit 200 loads the segment row address information (FSRAI, not shown) of at least one fail segment of the segments Seg0, . . . , Segm−1 in response to the activated set signal SET, compares the segment row address SRA of an access segment including a cell that is to be accessed received from the outside (e.g., from a controller) with the segment row address information (FSRAI, not shown) of the fail segment, and determines whether the access segment corresponds to a fail segment including defective cells. The segment match determining circuit 200 generates the load control signals LCS0, . . . LCSm−1 used to control the first column match determining circuit 220 and the second column match determining circuit 240 to load the fail column address information (FCAI, not shown) that will be described later according to a result of the comparison.

The first column match determining circuit 220 and the second column match determining circuit 240 load the fail column address information (FCAI, not shown) of the fail segment in response to the load control signals LCS0, . . . , and LCSm−1 that are activated and output by the segment match determining circuit 200. The first column match determining circuit 220 and the second column match determining circuit 240 receive the access column address CA from the outside (e.g., from a controller). The first column match determining circuit 220 and the second column match determining circuit 240 compare the access column address CA with the fail column address information (FCAI, not shown) and determine whether a column connected to the cell that is to be accessed corresponds to a fail column. The first column match determining circuit 220 generates a first column address replacement control signal CA_Rep1 according to a result of the comparison. The second column match determining circuit 240 generates a second column address replacement control signal CA_Rep2 according to the result of the comparison. The first column match determining circuit 220 and the second column match determining circuit 240 will be described in more detail with reference to FIG. 11.

The column decoder 40 disables the normal column Coli, where i is designated to a column including one or more fail memory cells, and enables a first spare column Scol0 in response to the first column address replacement control signal CA_Rep1. Alternatively, the column decoder 40 disables the normal column Colj, where j is designated to a column including one or more fail memory cells and enables a second spare column Scol1 in response to the second column address replacement control signal CA_Rep2. Although not shown in FIG. 10, the memory device 2000 may further include a row decoder (not shown) that enables a row corresponding to an access row address (not shown). Accordingly, the memory device 2000 may write data in the memory cell that is to be accessed or read the data from the memory cell according to a write control signal or a read control signal provided by a memory controller (not shown) if the repair circuit 20 does not perform a segment unit row repair operation.

Figure 11:
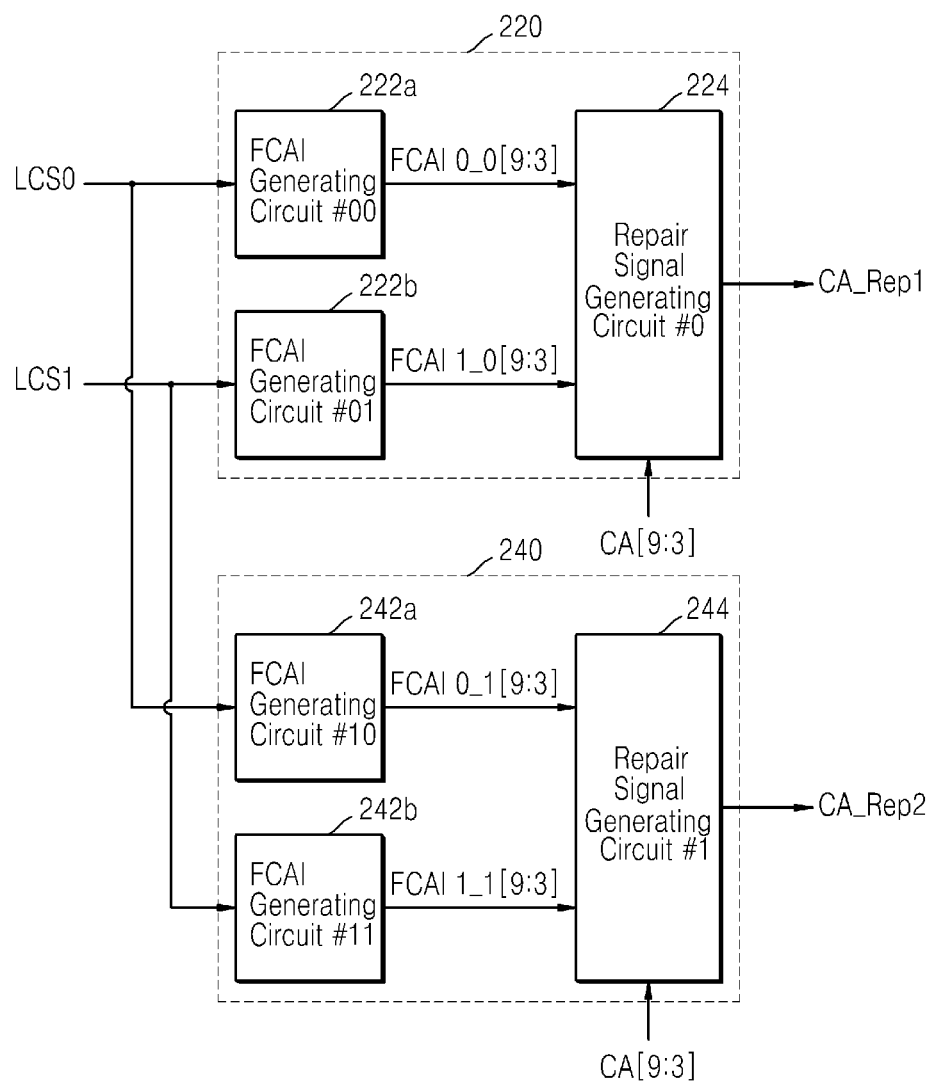
FIG. 11 is a block diagram of column match determining circuits of a repair circuit of FIG. 10 according to another embodiment.

FIG. 11 is a block diagram of the first and second column match determining circuits 220 and 240 of the repair circuit 20 of FIG. 10 according to another embodiment. The first and second column match determining circuits 220 and 240 of FIG. 11 are the same as or similar to the column match determining circuit 120 described with reference to FIGS. 3 and 4 in terms of constructions and operations, and thus redundant descriptions thereof will be omitted here. An example of a case where the segments Seg0, Seg1 among the segments Seg0, . . . , and Segm−1 of the memory cell array 30 correspond to fail segments, and two fail columns occur in the segments Seg0, Seg1 will now be described below (the same applies to FIG. 12).

Referring to FIGS. 10 and 11, the first column match determining circuit 220 may include first fail column address information generating circuits 222a and 222b and a first repair signal generating circuit 224. The first column match determining circuit 220 may determine whether first fail columns of the fail segments Seg0 and Seg1 are accessed. In more detail, the first fail column address information generating circuit 222a may output first fail column address information FCAI0_0[9:3] of the fail segment Seg0 to the first repair signal generating circuit 224 in response to the activated load control signal LCS0. The first repair signal generating circuit 224 may compare the access column address CA[9:3] received from the outside (e.g., from the controller) with the first fail column address information FCAI0_0[9:3], and generate the first column address replacement control signal CA_Rep1 according to a result of the comparison. Alternatively, the first fail column address information generating circuit 222b may output first fail column address information FCAI1_0[9:3] of the fail segment Seg1 to the first repair signal generating circuit 224 in response to the activated load control signal LCS1. The first repair signal generating circuit 224 may compare the access column address CA[9:3] received from the outside with the first fail column address information FCAI1_0[9:3], and generate the first column address replacement control signal CA_Rep1 according to a result of the comparison. Although two separate groups of lines are shown in FIG. 11, in one embodiment, the first fail column address information FCAI0_0[9:3] and FCAI1_0[9:3] may be commonly connected to one group of lines, and may be commonly input to the first repair signal generating circuit 224.

The second column match determining circuit 240 may include second fail column address information generating circuits 242a and 242b and a second repair signal generating circuit 244. The second column match determining circuit 240 may determine whether second fail columns of the fail segments Seg0, Seg1 are accessed. In more detail, the second fail column address information generating circuit 242a may output second fail column address information FCAI0_1[9:3] of the fail segment Seg0 to the second repair signal generating circuit 244 in response to the activated load control signal LCS0. The second repair signal generating circuit 244 may compare the access column address CA[9:3] received from the outside (e.g., from the controller) with the second fail column address information FCAI0_1[9:3], and generate the second column address replacement control signal CA_Rep2 according to a result of the comparison. Alternatively, the second fail column address information generating circuit 242b may output second fail column address information FCAI1_1[9:3] of the fail segment Seg1 to the second repair signal generating circuit 244 in response to the activated load control signal LCS1. The second repair signal generating circuit 244 may compare the access column address CA[9:3] received from the outside with the second fail column address information FCAI1_1[9:3], and generate the second column address replacement control signal CA_Rep2 according to a result of comparison.

Figure 12:
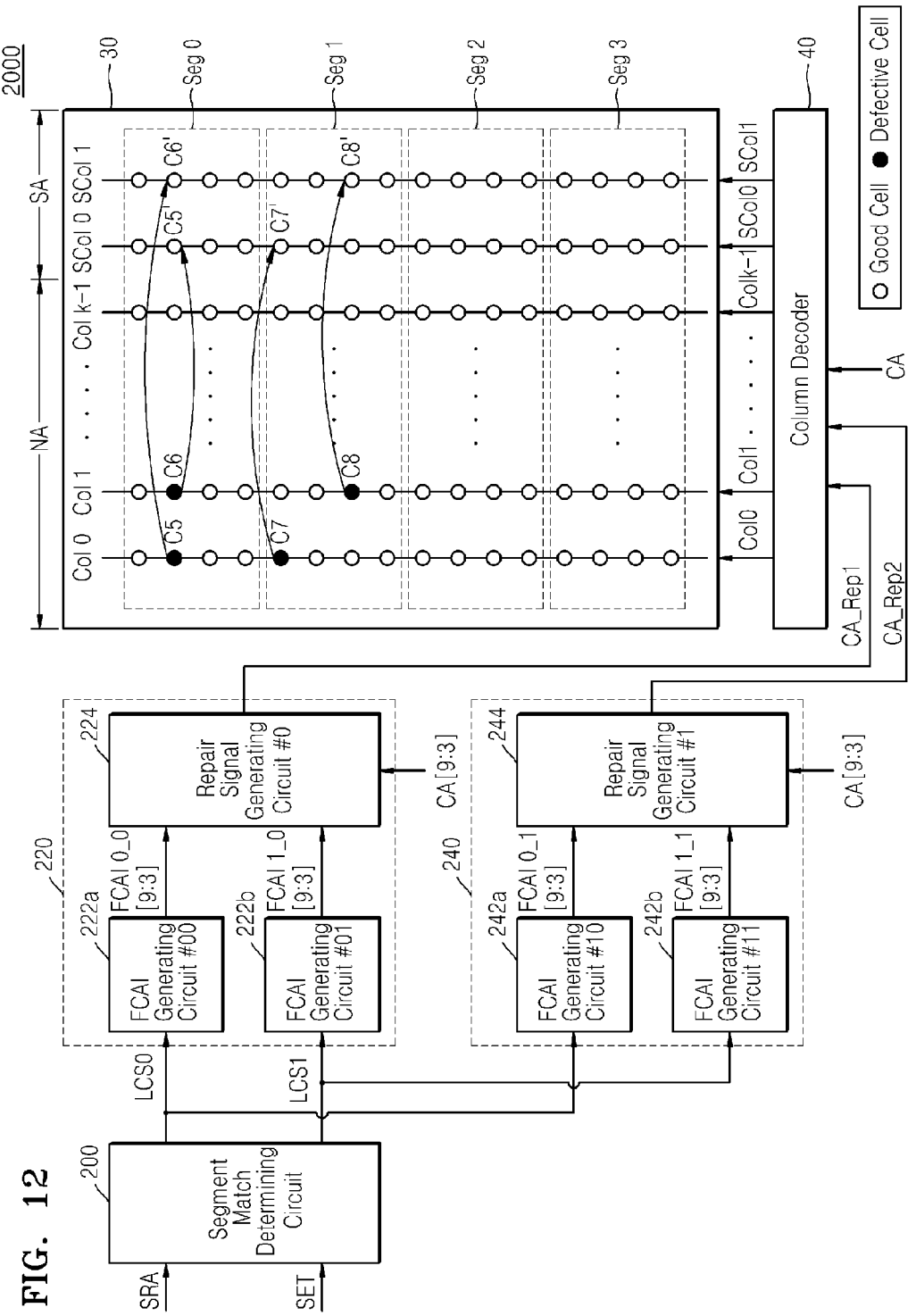
FIG. 12 is a diagram of the memory device of FIG. 10 that repairs defective cells, according to another embodiment.

FIG. 12 is a diagram of the memory device 2000 of FIG. 10 that repairs defective cells C5, C6, C7, and C8, according to another embodiment. In FIG. 12, the memory cell array 30 is divided into the four segments Seg0, . . . , Seg3 in a column direction. Regarding the constructions of the memory device 2000 of FIG. 12 that are the same as those described with reference to FIG. 1, operations thereof are also the same or similar, and thus redundant descriptions thereof will be omitted here.

Referring to FIGS. 10 through 12, location information regarding the defective cells C5, C6, C7, and C8 of the memory cell array 30 is obtained through a predetermined test regarding whether an error bit occurs during an operation of manufacturing the memory device 2000. Location information regarding a segment among the location information regarding the defective cells C5, C6, C7, and C8 may store in fail segment row address information generating circuits (not shown) of the segment match determining circuit 200 as the row address information FSRAI0 and FSRAI1 of the fail segments Seg0 and Seg1. Location information regarding a column of the defective cells C5 and C7 connected to a first fail column of each segment may store in the first fail column address information generating circuits 222a and 222b as the first fail column address information FCAI0_0[9:3], FCAI1_0[9:3], respectively. Location information regarding a column of the defective cells C6 and C8 connected to a second fail column of each segment may store in the second fail column address information generating circuits 242a and 242b as the second fail column address information FCAI0_1[9:3] and FCAI1_1[9:3], respectively.

In a case where the defective cell C5 is accessed, since the segment Seg0 that is accessed corresponds to a fail segment, the segment match determining circuit 200 outputs the activated load control signal LCS0 to the first and second fail column address information generating circuits 222a and 242a. The first fail column address information generating circuit 222a outputs the first fail column address information FCAI0_0[9:3] of the segment Seg0 to the first repair signal generating circuit 224 in response to the activated load control signal LCS0. The second fail column address information generating circuit 242a outputs the second fail column address information FCAI0_1[9:3] of the segment Seg0 to the second repair signal generating circuit 244 in response to the activated load control signal LCS0.

The first repair signal generating circuit 224 receives the column address CA0 of the defective cell C5 and compares the column address CA0 with the first fail column address information FCAI0_0[9:3]. Since they are the same according to a result of the comparison, the first repair signal generating circuit 224 activates and outputs the first column address replacement control signal CA_Rep1 to the column decoder 40. Meanwhile, since the column address CA0 of the defective cell C5 is not the same as the first fail column address information FCAI0_1[9:3], the second repair signal generating circuit 244 does not activate the second column address replacement control signal CA_Rep2. The column decoder 40 disables a normal column Col0 corresponding the defective cell C5 and enables the spare column Scol0 in response to the activated first column address replacement control signal CA_Rep1. Thus, if the defective cell C5 is accessed, the defective cell C5 is repaired by a space cell C5' of the spare memory cell array SA by accessing the spare cell C5', instead of the defective cell C5.

In the same manner as the defective cell C5 is accessed, if the defective cell C6 is accessed, the segment match determining circuit 200 outputs the activated load control signal LCS0 to the first and second fail column address information generating circuits 222a and 242a. the first fail column address information generating circuit 222a outputs the first fail column address information FCAI0_0[9:3] of the segment Seg0 to the first repair signal generating circuit 224 in response to the activated load control signal LCS0. The second fail column address information generating circuit 242a outputs the second fail column address information FCAI0_1[9:3] of the segment Seg0 to the second repair signal generating circuit 244 in response to the activated load control signal LCS0.

In this case, the second repair signal generating circuit 244 receives the column address CA1 of the defective cell C6 and compares the column address CA1 with the first fail column address information FCAI0_1[9:3]. Since they are the same according to a result of the comparison, the second repair signal generating circuit 244 activates and outputs the second column address replacement control signal CA_Rep2 to the column decoder 40. Meanwhile, since the column address CA1 of the defective cell C6 is not the same as the first fail column address information FCAI0_0[9:3], the first repair signal generating circuit 224 does not activate the first column address replacement control signal CA_Rep1. Thus, the column decoder 40 disables a normal column Col1 corresponding the defective cell C6 and enables the spare column Scol1 in response to the activated second column address replacement control signal CA_Rep2. Thus, if the defective cell C6 is accessed, the defective cell C6 is repaired by a space cell C6' of the spare memory cell array SA by accessing the spare cell C6', instead of the defective cell C6.

As described above, a defective cell connected to a first fail column of a fail segment may be repaired by a spare cell connected to the spare column SCol0 through the first column match determining circuit 220, and a defective cell connected to a second fail column of the fail segment may be repaired to a spare cell connected to the spare column SCol1 through the second column match determining circuit 240. In the same principle, if the defective cells C7 and C8 connected to different fail columns are accessed in the fail segment Seg1, the defective cells C7 and C8 may be repaired by spare cells C7' and C8' connected to the spare columns SCol0 and SCol1, respectively. Also, in the same principle as described above, if a fail column further exists in the fail segment, corresponding column match determining circuits and spare columns may be used to efficiently repair defective cells.

The memory device 2000 according to the present disclosure may minimize the number of spare cells in addition to normal cells and minimize the number of fuse circuits used to store location information of a fail column corresponding to a specific segment in which an error bit occurs, and thus a mass storage and compact memory device may be implemented. In particular, the memory device 2000 may repair all defective cells without skipping defective cells when defective cells locally occur in the memory cell array 30, thereby enhancing repair efficiency.

Figure 13:
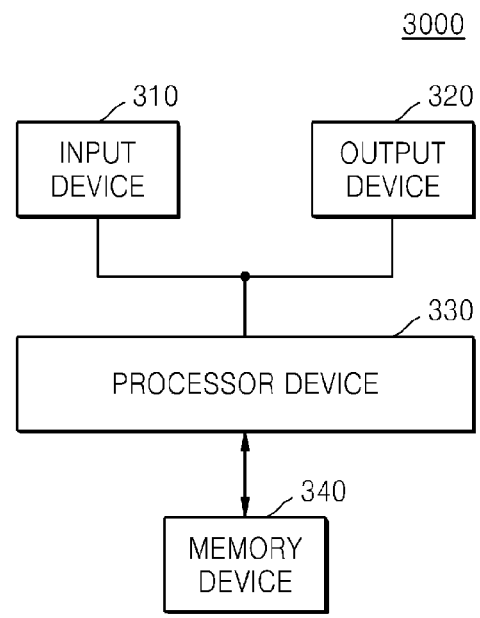
FIG. 13 is a block diagram of an electronic system including the memory device of FIG. 1, according to an embodiment.

FIG. 13 is a block diagram of an electronic system 3000 including the memory device 1000 of FIG. 1, according to an embodiment.

Referring to FIG. 13, the electronic system 3000 includes an input device 310, an output device 320, a processor device 330, and a memory device 340. The processor device 330 may control the input device 310, the output device 320, and the memory device 340 via corresponding interfaces. The processor device 330 may include at least one from among at least one microprocessor, a digital signal processor, a microcontroller, and logic devices capable of performing operations similar to those of the at least one microprocessor, the digital signal processor, and the microcontroller. The input device 310 and the output device 320 may include at least one selected from among a keypad, a keyboard, and a display device.

The memory device 340 may include the memory device 1000 including the repair circuit 10 of FIG. 1 or the repair circuit 12 of FIG. 9. Thus, the electronic system 3000 may be compact and may enhance data reliability.

Figure 14:
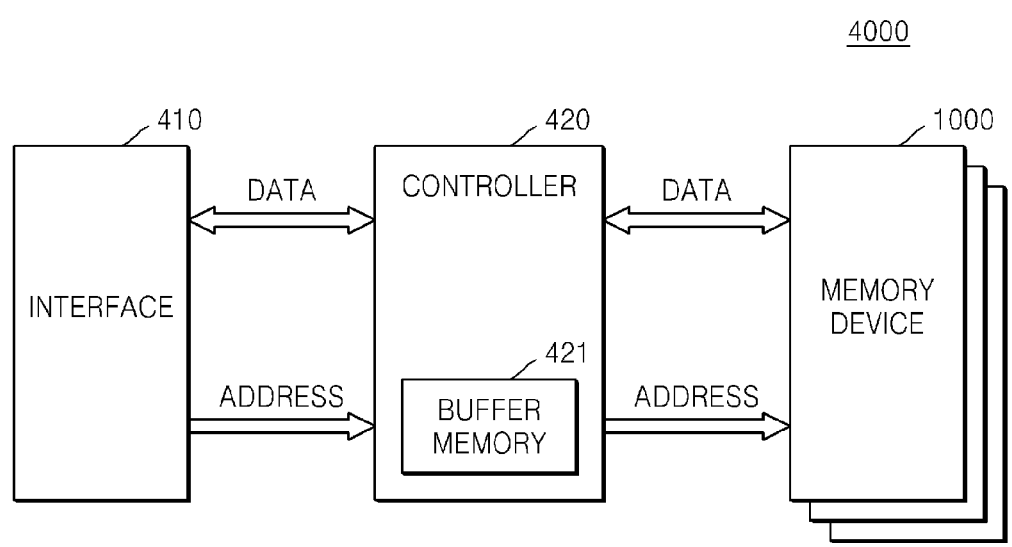
FIG. 14 is a block diagram of a memory system including the memory device of FIG. 1, according to an embodiment.

FIG. 14 is a block diagram of a memory system 4000 including the memory device 1000 of FIG. 1, according to an embodiment. Referring to FIG. 14, the memory system 4000 may include an interface unit 410, a controller 420, and the memory device 1000 of FIG. 1. The interface unit 410 may provide an interface between the memory system 4000 and a host (not shown). The interface circuit 410 may include a data exchange protocol corresponding to the host so as to interface with the host. The interface circuit 410 may be constructed to communicate with the host by using one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), and integrated drive electronics (IDE).

The controller 420 may receive data and an address from the outside via the interface circuit 410. The controller 420 may access the memory device 1000, based on data and an address received from the host. The controller 420 may provide the host with data read from the memory device 1000 via the interface circuit 410.

The controller 420 may include a buffer memory 421. The buffer memory 421 temporarily stores write data received from the host or data read from the memory device 1000. If data present in the memory device 1000 is cached when a request to perform a read command is received from the host, the buffer memory 421 supports a cache function of directly providing the cached data to the host. In general, a data transmission speed according to a bus format of the host, e.g., a SATA or a SAS, may be much faster than that of a memory channel in the memory system 4000. In other words, when an interfacing speed of the host is much faster than that of the memory channel, the buffer memory 421 may be used to minimize degradation in the performance of the memory system 4000, caused by this speed difference.

The memory device 1000 may be provided as a storage medium of the memory system 4000. For example, the memory device 1000 may include a flash memory device such as DRAM, DDR-SDRAM, etc. Furthermore, the memory device 2000 of FIG. 10 may be included in the memory system 4000 instead of the memory device 1000 of FIG. 1. Thus, the memory system 4000 may be compact and may enhance data reliability.

The memory system 4000 of FIG. 14 may be installed in information processors, such as a personal digital assistant (PDA), a mobile computer, a web tablet, a digital camera, a portable media player (PMP), a mobile phone, a wireless phone, or a lap-top computer. The memory system 4000 may be embodied as an MMC, a secure digital (SD) card, a micro SD card, a memory stick, an identification (ID) card, a personal computer memory card international association (PC-MCIA) card, a chip card, a USB card, a smart card, or a compact flash (CF) card.

Figure 15:
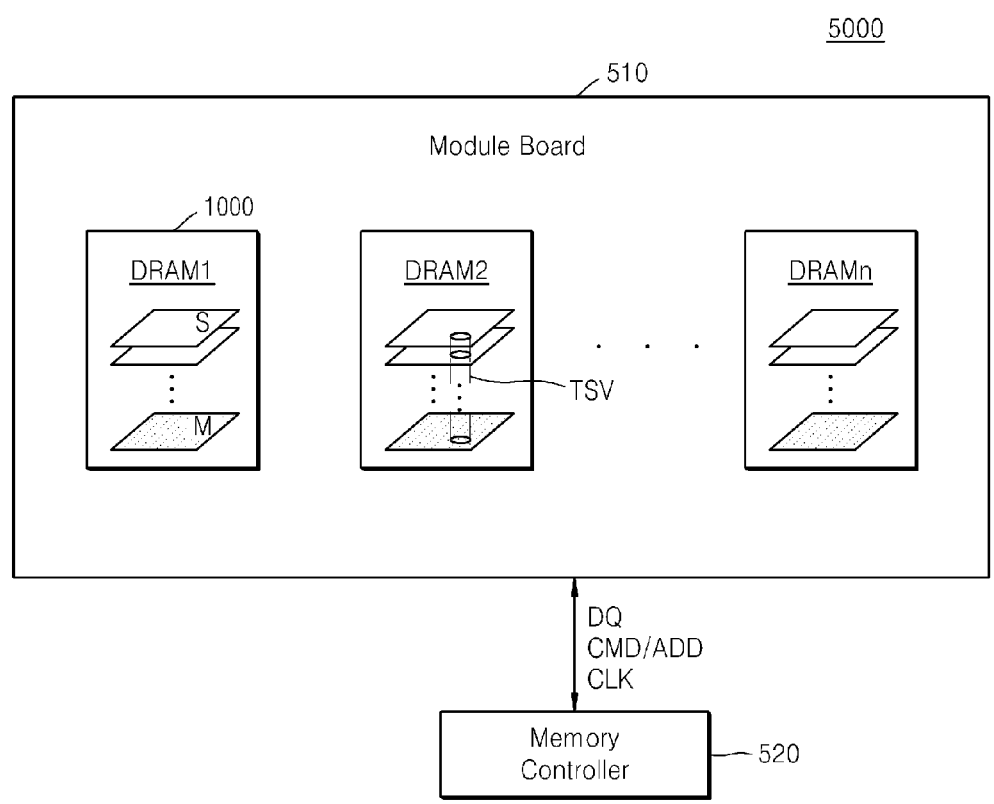
FIG. 15 is a diagram of a memory system to which the memory device of FIG. 1 is applied, according to an embodiment.

FIG. 15 is a diagram of a memory system 5000 to which the memory device 1000 of FIG. 1 is applied, according to an embodiment.

Referring to FIG. 15, the memory system 5000 may include a memory module 510 and a memory controller 520. The memory module 510 may have the at least one memory device 1000 mounted on a module board thereof. The memory device 1000 may be embodied as a DRAM chip, and may include a plurality of semiconductor layers. The semiconductor layers may include one or more master chips M and one or more slave chips S. Meanwhile, the memory module 510 may have the at least one memory device 2000 mounted according to an embodiment instead of the memory device 1000. Alternatively, the memory module 510 may simultaneously include the memory devices 1000 and 2000.

The memory device 1000 may include a repair circuit according to an embodiment. The repair circuit may be one of the one or more embodiments described above. The repair circuit may be included in one of the semiconductor layers or may be included in each of the semiconductor layers. Thus, the memory system 5000 may be compact and may enhance data reliability.

Signals may be transferred between the semiconductor layers by using through silicon vias (TSVs). Although the present embodiment describes a structure in which signals are transferred between the semiconductor layers by using TSVs, the disclosure is not limited thereto, and a structure in which the semiconductor layers are stacked through wire bonding, and tape with interposer or wire may be applied.

Furthermore, signals may be transferred between the semiconductor layers through an optical IO connection. For example, signals may be transmitted between the semiconductor layers by using a radiative method using radio frequency (RF) waves or ultrasonic waves, an inductive coupling method using magnetic induction, or a non-radiative method using magnetic field resonance.

The radiative method transfers a signal wirelessly by using a monopole or an antenna such as a planar inverted-F antenna. An electric field or a magnetic field that varies over time influences each other and thus radiation is generated. An antenna having the same frequency may receive a signal in accordance with polarization characteristics of incident waves.

The inductive coupling method generates a strong magnetic field in one direction by winding a coil several times, and the coil that resonates at a similar frequency is attracted and thus coupling is generated.

The non-radiative method uses evanescent wave coupling that moves electromagnetic waves between two media that resonate at the same frequency through a near distance electromagnetic field.

The memory module 510 may communicate with the memory controller 520 through a system bus. The system bus may be used to transmit and receive data DQ, a command/ address CMD/ADD, a clock signal CLK, etc. between the memory module 510 and the memory controller 520.

Figure 16:
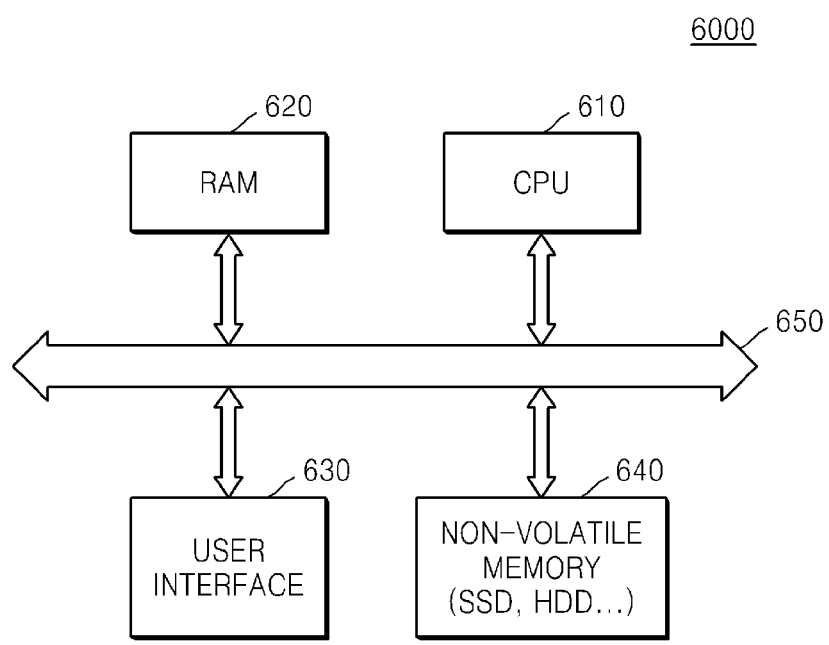
FIG. 16 is a block diagram of a computer system including a memory device, according to an embodiment.

FIG. 16 is a block diagram of a computer system 6000 including a memory device, according to an embodiment.

Referring to FIG. 16, the memory device of the inventive concept may be mounted in the computer system 6000 such as a mobile device or a desk top computer as RAM 620. The memory device mounted as the RAM 620 may apply one of the one or more embodiments described above. For example, the RAM 620 may apply to the memory device 1000 including the repair circuit 10 or 12, or may apply to a memory module. Thus, the computer system 6000 may be compact and may enhance data reliability. Meanwhile, the RAM 620 may include a memory device and a memory controller.

The computer system 6000 according to an embodiment of the inventive concept may include a central processing unit (CPU) 610, the RAM 620, a user interface 630, and a non-volatile memory 640, which are electrically connected to a bus 650. The non-volatile memory 640 may use a mass storage device such as an SSD or HDD.

If the computer system 6000 is a mobile device, a battery (not shown) may be additionally provided to apply an operating voltage to the computer system 6000. Although not shown, the computer system 60000 according to the inventive concept may further include an application chipset, a camera image processor (CIP), an input/output (I/O) device, and the like.

While the present disclosure has been particularly shown and described with reference to exemplary embodiments thereof, it will be understood that various changes in form and details may be made therein without departing from the spirit and scope of the following claims.

What is claimed is:

1. A memory device comprising:
   a memory cell array comprising normal memory cells and spare memory cells arranged in rows and columns including normal columns including the normal memory cells and at least one spare column including spare memory cells, wherein the rows are divided into a plurality of segments;
   a segment match determining circuit configured to compare a segment address received at the memory device with row address information corresponding to a failed segment and to generate a load control signal; and
   a column match determining circuit configured to compare column address information corresponding to a failed column in response to the load control signal with a column address received at the memory device and to generate a column address replacement control signal,
   wherein the memory device is configured to replace at least one of normal memory cells connected to the failed column of the failed segment with at least one corresponding spare memory cell connected to the at least one spare column in response to the column address replacement control signal, and
   wherein the segment match determining circuit comprises:
      at least one fail segment address information generating circuit configured to generate the row address information in response to a set signal; and
      at least one load control signal generating circuit configured to receive the row address, to compare the row address information with the row address, and to generate the load control signal according to a result of the comparison.

2. The memory device of claim 1, wherein the at least one fail segment address information generating circuit comprises a plurality of fuses corresponding to the number of bits included in the row address information of the failed segment.

3. The memory device of claim 2, wherein the at least one load control signal generating circuit comprises:
   a plurality of NXOR gates each configured to compare outputs of the plurality of fuse circuits with bits included in the row address; and
   an AND gate configured to input outputs of the plurality of NXOR gates and to generate the load control signal.

4. The memory device of claim 1, wherein the number of each of the at least one fail segment address information generating circuit and the at least one load control signal generating circuit is less than a number of the plurality of segments.

5. The memory device of claim 1, wherein the segment match determining circuit further comprises:
   at least one level selecting circuit configured to receive at least one bit included in the row address, to select a logic level of the at least one bit, and to output the at least one bit having the selected logic level to the at least one load control signal generating circuit,
   wherein the at least one load control signal generating circuit is further configured to receive the at least one bit having the selected logic level, and to compare bits other than the at least one bit having the selected logic level with the row address information of the fail segment.

6. The memory device of claim 5, wherein the at least one level selecting circuit comprises at least one inverter, and wherein the at least one load control signal generating circuit comprises:
   a plurality of NXOR gates each configured to the bits other than the at least one bit having the selected logic level with bits included in the row address; and
   an AND gate configured to input the output of the at least one level selecting circuit and outputs of the plurality of NXOR gates and to generate the load control signal.

7. The memory device of claim 1, wherein the column match determining circuit comprises:
   at least one fail column address information generating circuit configured to generate the failed column address information in response to the load control signal; and
   a repair signal generating circuit configured to receive the column address, to compare the failed column address information with the column address, and to generate the column address replacement control signal according to a result of the comparison.

8. The memory device of claim 7, wherein the number of the at least one fail column address information generating circuit is smaller than or equal to the number of the plurality of segments.

9. The memory device of claim 8, wherein the at least one fail column address information generating circuit comprises a plurality of fuse circuits corresponding to the number of bits included in the fail column address information.

10. The memory device of claim 9, wherein the repair signal generating circuit comprises:
    a plurality of NXOR gates each configured to compare outputs of the plurality of fuse circuits with bits included in the column address; and
    an AND gate configured to compare outputs of the plurality of NXOR gates and to generate the column address replacement control signal.

* * * * *